(12) United States Patent
Kuwahara et al.

(10) Patent No.: US 11,139,192 B2
(45) Date of Patent: Oct. 5, 2021

(54) SUBSTRATE TREATING APPARATUS AND SUBSTRATE TRANSPORTING METHOD

(71) Applicant: SCREEN Holdings Co., Ltd., Kyoto (JP)

(72) Inventors: Joji Kuwahara, Kyoto (JP); Koji Kaneyama, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/721,991

(22) Filed: Dec. 20, 2019

(65) Prior Publication Data

US 2020/0211882 A1 Jul. 2, 2020

(30) Foreign Application Priority Data

Dec. 28, 2018 (JP) .............................. JP2018-248738

(51) Int. Cl.
*H01L 21/677* (2006.01)
*B65G 1/04* (2006.01)

(52) U.S. Cl.
CPC ...... *H01L 21/67778* (2013.01); *B65G 1/0457* (2013.01); *H01L 21/67766* (2013.01); *H01L 21/67769* (2013.01)

(58) Field of Classification Search
CPC ......... H01L 21/67161; H01L 21/67178; H01L 21/67155; H01L 21/67739; H01L 21/6719;

(Continued)

(56) References Cited

U.S. PATENT DOCUMENTS 4,693,777 A * 9/1987 Hazano .................... B25J 9/107
118/50
5,876,280 A * 3/1999 Kitano .............. H01L 21/67178
454/187

(Continued)

FOREIGN PATENT DOCUMENTS

JP 2001-300445 A 10/2001
JP 2011-187796 A 9/2011

(Continued)

OTHER PUBLICATIONS

Office Action dated Jul. 1, 2020 for corresponding Taiwan Patent Application No. 108147766.

(Continued)

*Primary Examiner* — Glenn F Myers
(74) *Attorney, Agent, or Firm* — Ostrolenk Faber LLP

(57) ABSTRACT

Disclosed are a substrate treating apparatus and a substrate transporting method. A first ID block takes a substrate from a carrier placed on a carrier platform and sends the taken substrate to one of six treatment layers. Moreover, a second ID block returns the substrate, sent from the treatment layer, for example, to a carrier placed on a platform. This allows the first ID block to transport many substrates to the six treatment layers arranged in an upward/downward direction more rapidly. Moreover, this simultaneously allows the second ID block to transport many substrates, having been sent from the six treatment layers arranged in the upward/downward direction, to the carrier more rapidly. As a result, a throughput of a substrate treating apparatus can be enhanced.

12 Claims, 25 Drawing Sheets

(58) Field of Classification Search
CPC ......... H01L 21/67778; H01L 21/67766; H01L 21/67769; H01L 21/6773; H01L 21/67736; H01L 21/67748; H01L 21/67733; B65G 1/0457
See application file for complete search history.

(56) References Cited

U.S. PATENT DOCUMENTS

| | | | |
|---|---|---|---|
| 6,473,151 B1 * | 10/2002 | Deguchi | G03F 7/70991 |
| | | | 118/719 |
| 7,578,240 B2 * | 8/2009 | Shiwaku | H01L 21/67715 |
| | | | 104/88.01 |
| 2001/0013161 A1 * | 8/2001 | Kitano | H01L 21/67778 |
| | | | 29/25.01 |
| 2009/0165950 A1 | 7/2009 | Kim et al. | 156/345.1 |
| 2011/0222994 A1 | 9/2011 | Inagaki et al. | 414/222.07 |
| 2014/0022521 A1 | 1/2014 | Harumoto et al. | 355/27 |
| 2017/0244070 A1 | 8/2017 | Bangert et al. | |
| 2018/0061690 A1 * | 3/2018 | Kure | H01L 21/67069 |

FOREIGN PATENT DOCUMENTS

| | | |
|---|---|---|
| JP | 2014-022570 A | 2/2014 |
| KR | 10-0892756 B1 | 4/2009 |
| TW | 201733689 A | 10/2017 |

OTHER PUBLICATIONS

Office Action dated May 28, 2021 for corresponding Korean Patent Application No. 10-2019-0175135.

* cited by examiner

Fig. 20A
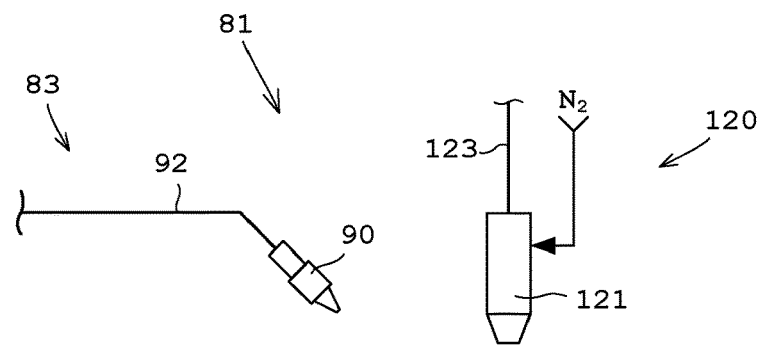
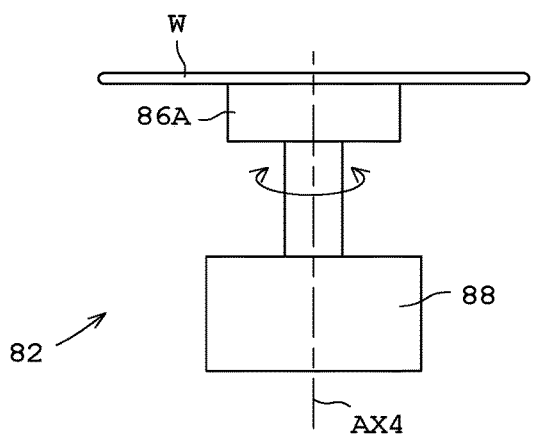
Fig. 20B
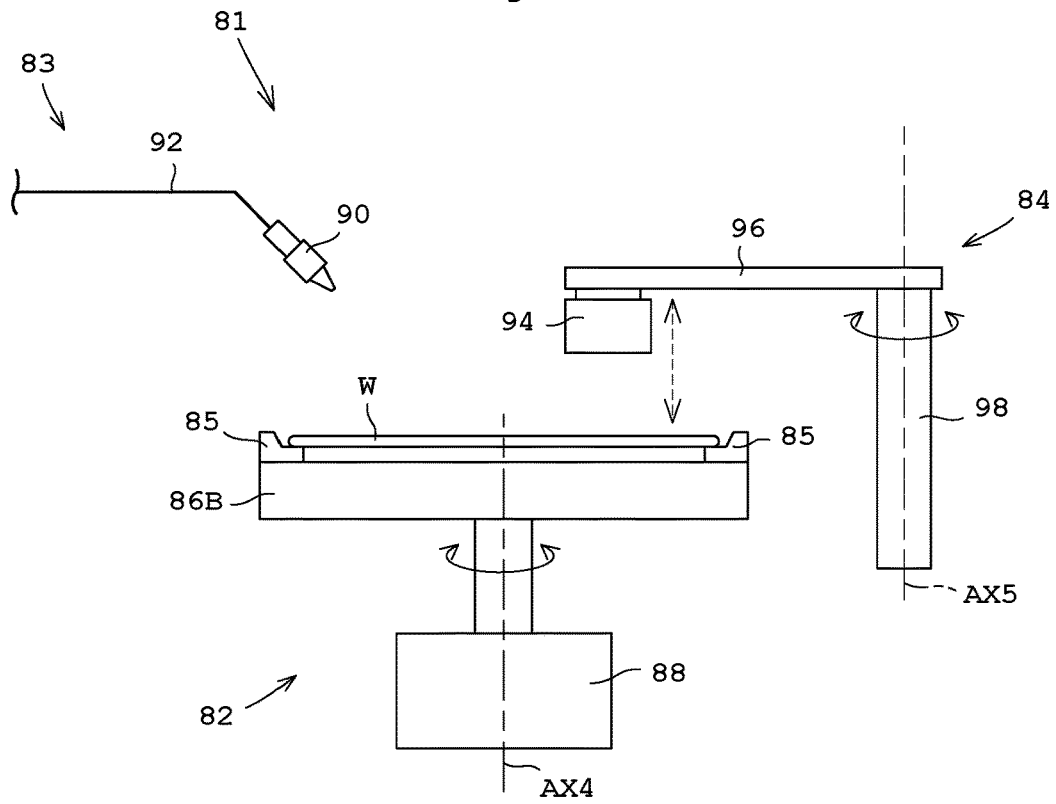

SUBSTRATE TREATING APPARATUS AND SUBSTRATE TRANSPORTING METHOD

CROSS-REFERENCE TO RELATED APPLICATIONS

This application claims priority to Japanese Patent Application No. 2018-248738 filed Dec. 28, 2018, the subject matter of which is incorporated herein by reference in entirety.

BACKGROUND OF THE INVENTION

Field of the Invention

The present invention relates to a substrate treating apparatus for performing treatment on substrates and a substrate transporting method for the substrate treating apparatus. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus includes an indexer block and a treating block (e.g., Japanese Unexamined Patent Application Publication No. 2014-022570). The indexer block includes a carrier platform on which a carrier capable of accommodating a plurality of substrates is placed, and a substrate transporting robot configured to transport a substrate between the carrier disposed on the carrier platform and the treating block. The treating block applies a resist liquid, for example, to the substrate.

Moreover, the substrate treating apparatus includes a stocker device (carrier buffer device). See for example, Japanese Unexamined Patent Application Publication No. 2011-187796A. The stocker device is disposed so as to extend horizontally toward the carrier platform. The stocker device includes keeping shelves for keeping carriers, and a carrier transport mechanism.

SUMMARY OF THE INVENTION

However, the currently-used substrate treating apparatus with such a configuration as above possesses the following drawback. Specifically, the indexer block of the substrate treating apparatus performs a substrate transportation process including a sending step and a return step. The sending step is a process in which a substrate is taken from the carrier placed on the carrier platform, and the taken substrate is transported to the treating block. Moreover, the return step is a process in which the substrate treated in the treating block is received from the treating block, and the received substrate is returned to the carrier placed on the carrier platform described above. In view of the sending step, the return step may result in reduction of throughput. Moreover, in view of the return step, the sending step may result in reduction of throughput.

The present invention has been made regarding the state of the art noted above, and its object is to provide a substrate treating apparatus and a substrate transporting method that achieve an enhanced throughput.

Solution to Problem

To achieve the object, the present invention provides a configuration as follows. One aspect of the present invention provides a substrate treating apparatus for performing treatment on a substrate. The substrate treating apparatus includes: a first indexer block on which a first carrier platform for placing a carrier capable of accommodating a plurality of substrates thereon is disposed; a single treating block connected to the first indexer block and in which a plurality of treatment layers is arranged in an upward/downward direction; a second indexer block connected to the single treating block and on which a second carrier platform for placing a carrier thereon is disposed; wherein the first indexer block takes a substrate from the carrier placed on the first carrier platform and transports the taken substrate to one of the treatment layers, the treatment layers each perform a predetermined treatment to the transported substrate, and transport the substrate to the second indexer block, and the second indexer block returns back the substrate treated in the treatment layer to the carrier placed on the second carrier platform.

With the substrate treating apparatus according to the aspect of the present invention, the first indexer block takes a substrate from the carrier placed on the first carrier platform and sends the taken substrate to one of the treatment layers. Moreover, the second indexer block returns the substrate, having been sent from the treatment layer, to the carrier placed on the second carrier platform. This allows the first indexer block to transport many substrates to the treatment layers arranged in the upward/downward direction more rapidly. Moreover, this simultaneously allows the second indexer block to transport many substrates, having been sent from the treatment layers arranged in the upward/downward direction, to the carrier more rapidly. As a result, a throughput of the substrate treating apparatus can be enhanced.

Moreover, the following is preferred. That is, in the substrate treating apparatus described above, the first indexer block takes a substrate from the carrier placed on the first carrier platform and transports the substrate to a first treatment layer of the treatment layers; the first treatment layer performs a predetermined treatment to the transported substrate, and transports the substrate to the second indexer block, the second indexer block transports the transported substrate to a second treatment layer of the treatment layers, the second treatment layer performs a predetermined treatment to the transported substrate, and transports the substrate to the first indexer block, the first indexer block transports the transported substrate to a third treatment layer of the treatment layers, the third treatment layer performs a predetermined treatment to the transported substrate, and transports the substrate to the second indexer block, and the second indexer block returns the substrate, treated in the third treatment layer, to the carrier placed on the second carrier platform.

The treatment layers each send the substrate from the indexer block as a start of sending the substrate to the indexer block opposite thereto. The substrate platform used for substrate transportation is disposed between the treatment layer and the indexer block. When the substrate is returned to the indexer block as the start of sending the substrate, two types of substrate platforms, i.e., a substrate platform for sending and a substrate platform for return, have to be disposed adjacent to one of the indexer blocks. Accordingly, the numbers of substrates W placeable on the substrate platform for sending and the substrate platform for return become limitative. However, the substrate is sent from the indexer block as a start of sending the substrate to the indexer block opposite thereto, ensuring the number of substrates placeable on the substrate platforms. In addition, since the two indexer blocks alternately transport the substrates, substrate transportation for loading and unloading the substrate with respect to the carrier and substrate transportation between the treatment layers can be shared substantially evenly with the two indexer blocks.

Moreover, the following is preferred. That is, in the substrate treating apparatus described above, the first indexer block takes a substrate from the carrier placed on the first carrier platform and transports the substrate to a first treatment layer of the treatment layers; the first treatment layer performs a predetermined treatment to the transported substrate, and transports the substrate to the second indexer block, the second indexer block transports the transported substrate to a second treatment layer of the treatment layers, the second treatment layer performs a predetermined treatment to the transported substrate, and transports the substrate to the second indexer block, the second indexer block returns the substrate, treated in the second treatment layer, to the carrier placed on the second carrier platform.

In the configuration where the first treatment layer and the second treatment layer each perform a predetermined treatment to a substrate in order, substrate transportation for loading and unloading the substrate with respect to the carrier and substrate transportation between the treatment layers can be shared with the two indexer blocks.

Moreover, the following is preferred. That is, in the substrate treating apparatus described above, the second indexer block transports the substrate, treated and transported in the second treatment layer, to a third treatment layer of the treatment layers, the third treatment layer performs a predetermined treatment to the transported substrate, and transports the substrate to the second indexer block, and the second indexer block returns the substrate, treated in the third treatment layer, to the carrier placed on the second carrier platform.

In the configuration where the first treatment layer, the second treatment layer, and the third treatment layer each perform a predetermined treatment to a substrate in order, substrate transportation for loading and unloading the substrate with respect to the carrier and substrate transportation between the treatment layers can be shared with the two indexer blocks.

Moreover, the following is preferred. That is, in the substrate treating apparatus described above, the second indexer block is further configured to load and unload the substrate with respect to an external device, the second indexer block unloads the substrate, treated in the first treatment layer, to the external device, the second indexer block loads the substrate, subjected to a predetermined treatment by the external device, from the external device and sends the loaded substrate to the second treatment layer of the treatment layers.

In the configuration where the first treatment layer, the second treatment layer, and the external device each perform a predetermined treatment to a substrate in order, substrate transportation for loading and unloading the substrate with respect to the carrier and substrate transportation between the treatment layers can be shared with the two indexer blocks.

Moreover, the following is preferred. That is, in the substrate treating apparatus described above, the first indexer block takes a substrate from the carrier placed on the first carrier platform and transports the substrate to a first treatment layer of the treatment layers; the first treatment layer performs a predetermined treatment to the transported substrate, and transports the substrate to the first indexer block, the first indexer block transports the transported substrate to a second treatment layer of the treatment layers, the second treatment layer performs a predetermined treatment to the transported substrate, and transports the substrate to the second indexer block, the second indexer block returns the substrate, treated in the second treatment layer, to the carrier placed on the second carrier platform.

In the configuration where the first treatment layer and the second treatment layer each perform a predetermined treatment to a substrate in order, substrate transportation for loading and unloading the substrate with respect to the carrier and substrate transportation between the treatment layers can be shared with the two indexer blocks.

Moreover, the following is preferred. That is, in the substrate treating apparatus described above, the second indexer block transports the substrate, treated and transported in the second treatment layer, to a third treatment layer of the treatment layers, the third treatment layer performs a predetermined treatment to the transported substrate, and transports the substrate to the second indexer block, and the second indexer block returns the substrate, treated in the third treatment layer, to the carrier placed on the second carrier platform.

In the configuration where the first treatment layer, the second treatment layer, and the third treatment layer each perform a predetermined treatment to a substrate in order, substrate transportation for loading and unloading the substrate with respect to the carrier and substrate transportation between the treatment layers can be shared evenly with the two indexer blocks.

Moreover, the following is preferred. That is, in the substrate treating apparatus described above, the second indexer block is further configured to load and unload the substrate with respect to an external device, the second indexer block unloads the substrate, treated in the second treatment layer, to the external device, the second indexer block loads the substrate, subjected to a predetermined treatment by the external device, from the external device and sends the loaded substrate to the third treatment layer of the treatment layers.

In the configuration where the first treatment layer, the second treatment layer, the third treatment layer, and the external device each perform a predetermined treatment to a substrate in order, substrate transportation for loading and unloading the substrate with respect to the carrier and substrate transportation between the treatment layers can be shared with the two indexer blocks.

Moreover, the following is preferred. That is, in the substrate treating apparatus described above, the first indexer block takes a substrate from the carrier placed on the first carrier platform and transports the substrate to a first treatment layer of the treatment layers; the first treatment layer performs a predetermined treatment to the transported substrate, and transports the substrate to the first indexer block, the first indexer block transports the transported substrate to a second treatment layer of the treatment layers, the second treatment layer performs a predetermined treatment to the transported substrate, and transports the substrate to the first indexer block, the first indexer block transports the transported substrate to a third treatment layer of the treatment layers, the third treatment layer performs a predetermined treatment to the transported substrate, and transports the substrate to the second indexer block, and the second indexer block returns the substrate, treated in the third treatment layer, to the carrier placed on the second carrier platform.

In the configuration where the first treatment layer, the second treatment layer, and the third treatment layer each perform a predetermined treatment to a substrate in order, substrate transportation for loading and unloading the substrate with respect to the carrier and substrate transportation between the treatment layers can be shared with the two indexer blocks.

Moreover, the following is preferred. That is, in the substrate treating apparatus described above, the second indexer block is further configured to load and unload the substrate with respect to an external device, the second indexer block takes a substrate from the carrier placed on the second carrier platform and transports the substrate to a first treatment layer of the treatment layers; the first treatment layer performs a predetermined treatment to the transported substrate, and transports the substrate to the second indexer block, the second indexer block unloads the substrate, treated in the first treatment layer, to the external device, the second indexer block loads the substrate, subjected to a predetermined treatment by the external device, from the external device and transports the loaded substrate to a second treatment layer of the treatment layers, the second treatment layer performs a predetermined treatment to the transported substrate, and transports the substrate to the first indexer block, the first indexer block returns the substrate, treated in the second treatment layer, to the carrier placed on the first carrier platform.

In the configuration where the first treatment layer, the second treatment layer, and the external device each perform a predetermined treatment to a substrate in order, substrate transportation for loading and unloading the substrate with respect to the carrier and substrate transportation between the treatment layers can be shared with the two indexer blocks.

Moreover, the following is preferred. That is, in the substrate treating apparatus described above, the second indexer block is further configured to load and unload the substrate with respect to an external device, the second indexer block takes a substrate from the carrier placed on the second carrier platform and transports the substrate to a first treatment layer of the treatment layers; the first treatment layer performs a predetermined treatment to the transported substrate, and transports the substrate to the first indexer block, the first indexer block transports the transported substrate to a second treatment layer of the treatment layers, the second treatment layer performs a predetermined treatment to the transported substrate, and transports the substrate to the second indexer block, the second indexer block unloads the substrate, treated in the second treatment layer, to the external device, the second indexer block loads the substrate, subjected to a predetermined treatment by the external device, from the external device and transports the loaded substrate to the third treatment layer of the treatment layers, the third treatment layer performs a predetermined treatment to the transported substrate, and transports the substrate to the first indexer block, and the first indexer block returns the substrate, treated in the third treatment layer, to the carrier placed on the first carrier platform.

In the configuration where the first treatment layer, the second treatment layer, the third treatment layer, and the external device each perform a predetermined treatment to a substrate in order, since the two indexer blocks alternately transport the substrates, substrate transportation for loading and unloading the substrate with respect to the carrier and substrate transportation between the treatment layers can be shared with the two indexer blocks. Moreover, the substrate is sent from the indexer block as a start of sending the substrate to the indexer block opposite thereto, ensuring the number of substrates placeable on the substrate platforms.

It is preferred that the substrate treating apparatus described above further includes a carrier transport mechanism configured to transport the carrier between the first carrier platform and the second carrier platform. For instance, when all the substrates are taken from the carrier placed on the first carrier platform, the carrier transport mechanism is capable of transporting the carrier placed on the first carrier platform to the second carrier platform since the transport mechanism returns the substrates to the carrier on the first carrier platform.

It is preferred in the substrate treating apparatus described above that the carrier transport mechanism is mounted on the single treating block. A currently-used carrier transport mechanism is disposed horizontally with respect to the indexer block. With the configuration of the present invention, the carrier transport mechanism is disposed on the single treating block. Accordingly, an installation area of the currently-used carrier transport mechanism disposed horizontally with respect to the indexer block can be decreased. In other words, reduction in footprint of the substrate treating apparatus is obtainable.

Another aspect of the present invention provides a substrate transporting method for a substrate treating apparatus. The substrate treating apparatus includes: a first indexer block on which a first carrier platform for placing carriers capable of accommodating a plurality of substrates thereon is disposed; and a single indexer block connected to the first indexer block and in which a plurality of treatment layers is arranged in an upward/downward direction; the method comprising: a taking and transporting step of causing the first indexer block to take a substrate from the carrier placed on the first carrier platform and to transport the taken substrate to one of the treatment layers; a treating and transporting step of causing each of the treatment layers to perform a predetermined treatment to the transported substrate, and to transport the substrate to a second indexer block connected to the single treating block; and a returning step of causing the second indexer block to return the substrate, treated in the treatment layer, to a carrier placed on a second carrier platform provided in the second indexer block.

According to the aspect of the substrate transporting method according to the present invention, the first indexer block takes a substrate from the carrier placed on the first carrier platform and sends the taken substrate to one of the treatment layers. Moreover, the second indexer block returns the substrate, having been sent from the treatment layer, to the carrier placed on the second carrier platform. This allows the first indexer block to transport many substrates to the treatment layers arranged in the upward/downward direction more rapidly. Moreover, this simultaneously allows the second indexer block to transport many substrates, having been sent from the treatment layers arranged in the upward/downward direction, to the carrier more rapidly. As a result, a throughput of the substrate treating apparatus can be enhanced.

Advantageous Effects of Invention

The substrate treating apparatus and the substrate transporting method according to the present invention achieve an enhanced throughput.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 20A and 20B each illustrate a cleaning device.

FIRST EMBODIMENT

A first embodiment of the present invention will now be described with reference to the drawings. In the following description, a face of a substrate where various patterns such as circuit patterns are formed is referred to as a front face, and a face opposite to the front face is referred to as a rear face. Moreover, a face of the substrate directed downwardly is referred to as a lower face, and a face of the substrate directed upwardly is referred to as an upper face.

Figure 1:
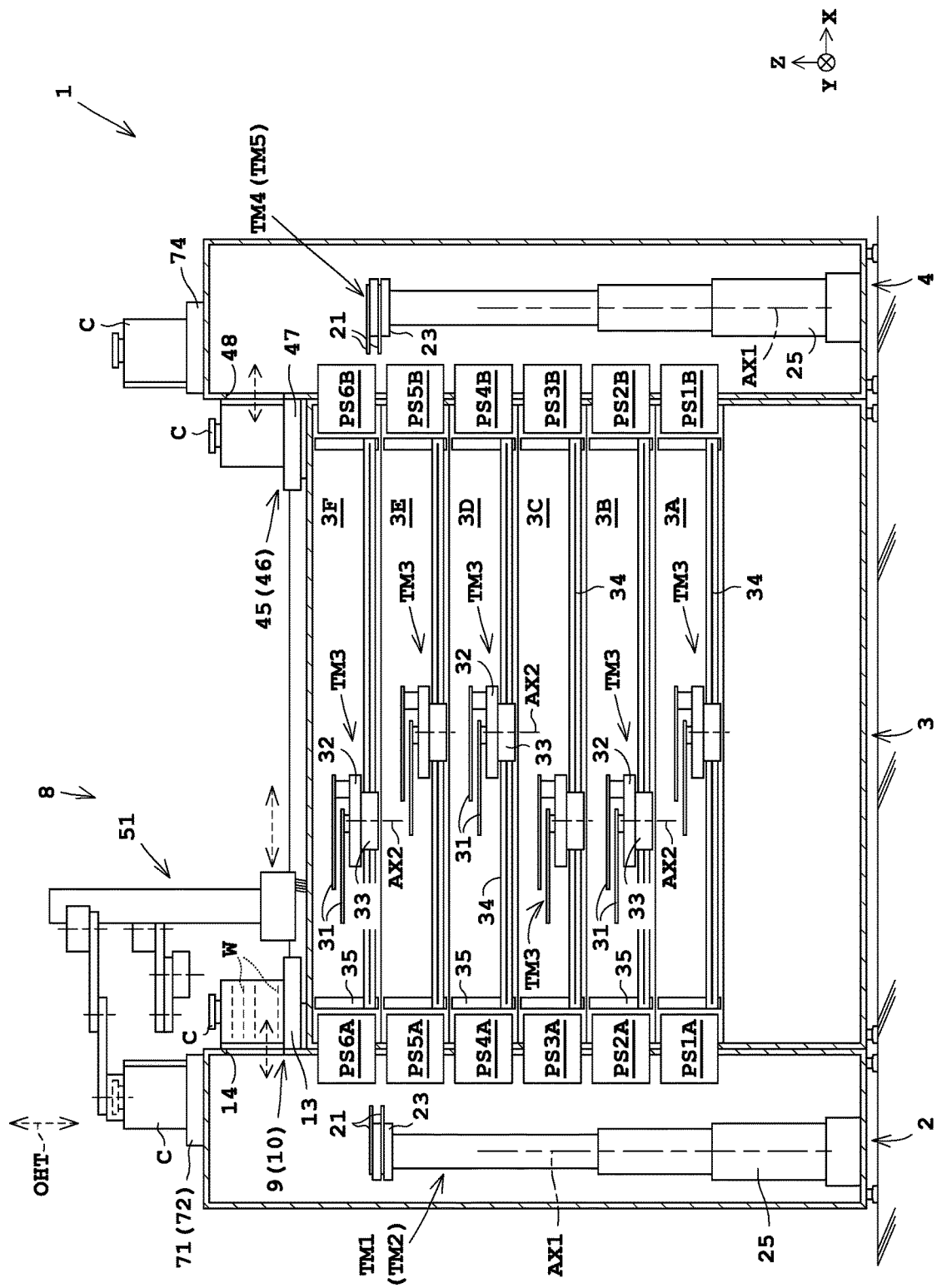
FIG. 1 is a longitudinal cross-sectional view of a substrate treating apparatus according to a first embodiment.
Figure 2:
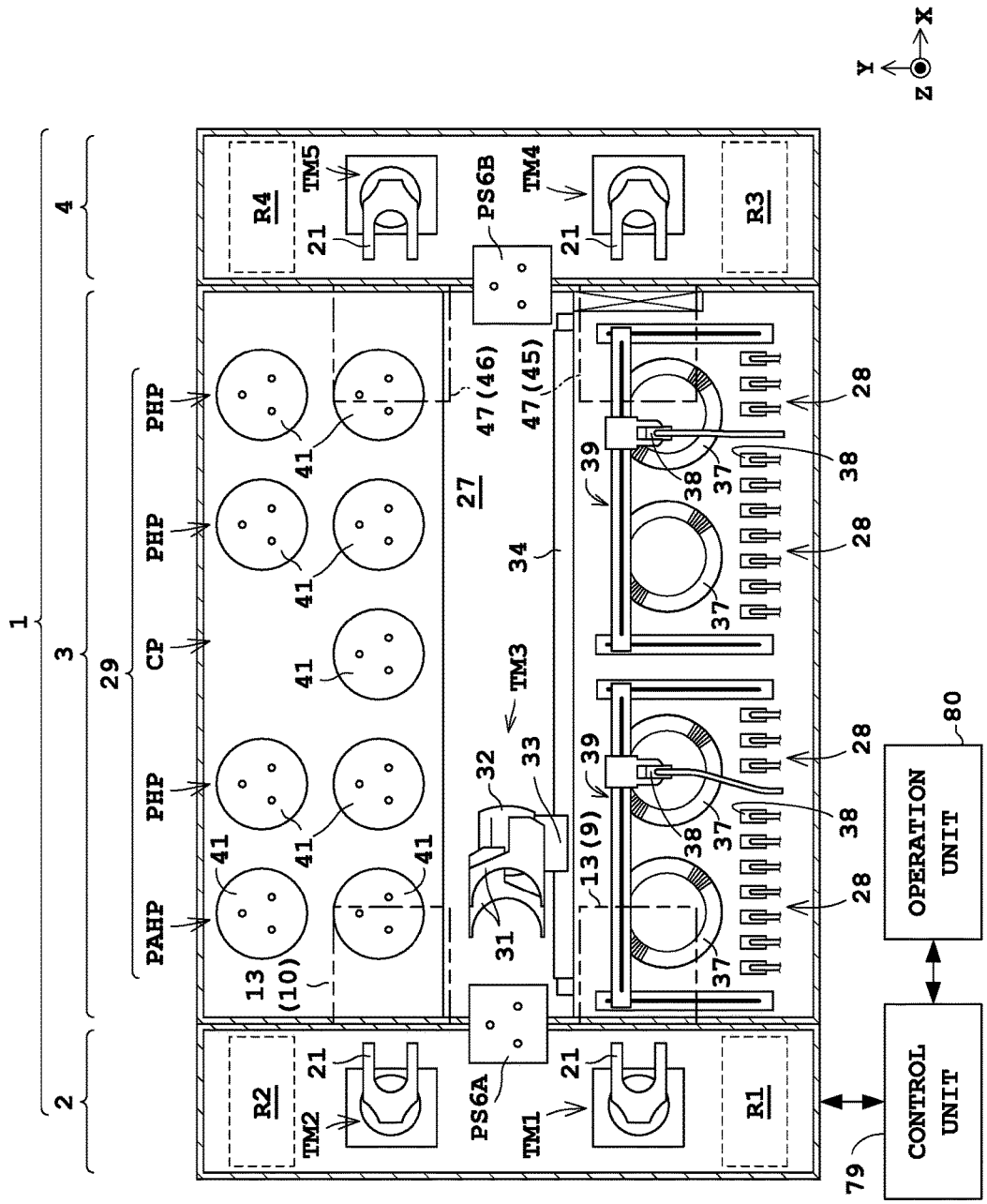
FIG. 2 is a horizontal cross-sectional view of the substrate treating apparatus according to the first embodiment.
Figure 3:
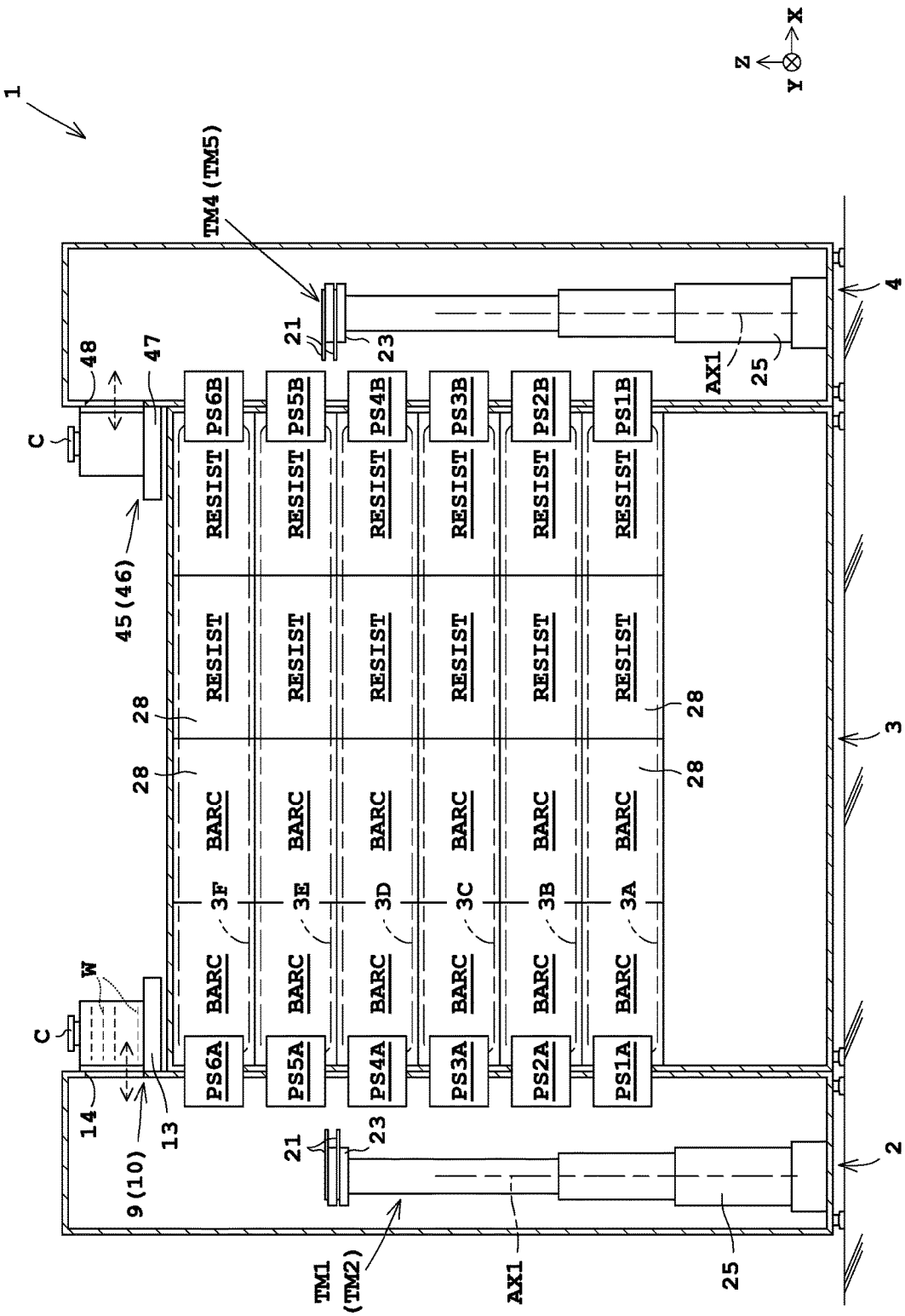
FIG. 3 is a right side view of the substrate treating apparatus according to the first embodiment.
Figure 4:
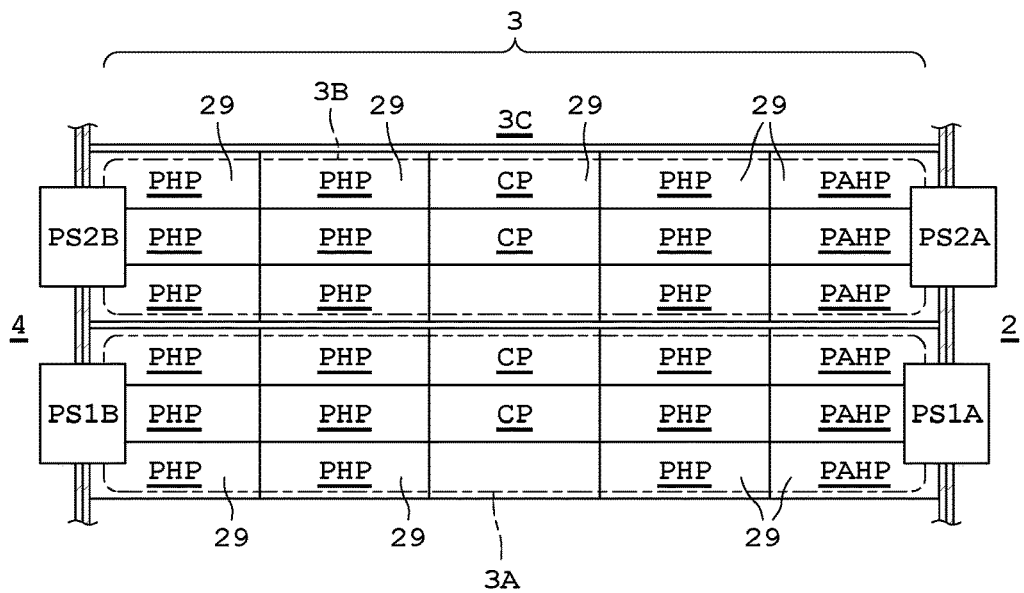
FIG. 4 is a partial left side view of the substrate treating apparatus according to the first embodiment.

FIG. 1 is a longitudinal cross-sectional view of a substrate treating apparatus 1 according to a first embodiment. FIG. 2 is a horizontal cross-sectional view of the substrate treating apparatus 1. FIG. 3 is a right side view of the substrate treating apparatus 1. FIG. 4 is a partial left side view of the substrate treating apparatus 1.

Reference is made to FIGS. 1 and 2. The substrate treating apparatus 1 includes a first indexer block (hereinafter, referred to as a "first ID block" where appropriate) 2, a single treating block 3, a second indexer block (hereinafter, referred to as a "second ID block" where appropriate) 4, and a carrier buffer device 8. The first ID block 2, the treating block 3, and the second ID block 4 are arranged linearly in line.

[Configuration of First Indexer Block 2]

The first ID block 2 includes two openers 9, 10 (see FIGS. 2 and 6), and two substrate transport mechanisms (robots) TM1, TM2. The two openers (carrier mount tables) 9, 10 provided in the first ID block 2 each include a carrier C placed thereon.

The carrier C is capable of accommodating a plurality of (e.g., 25) substrates W in a horizontal orientation. For instance, a FOUP (Front Open Unified Pod) is used as the carrier C. Alternatively, a container except the FOUP (e.g., a Standard Mechanical Inter Face (SMIF) pod) is usable. The carrier C includes, for example, a carrier body with an opening formed therein through which the substrates W are inserted or taken out and configured to accommodate the substrates W, and a lid for covering the opening of the carrier body.

The openers 9, 10 each include a platform 13 on which the carrier C is placed, an opening 14 through which the substrates W pass, a shutter (not shown) configured to open and close the opening 14 and to attach and detach the lid to and from the carrier body, and a shutter drive mechanism (not shown) configured to drive the shutter. The shutter drive mechanism includes an electric motor. Here, the shutter detaches the lid from the carrier body, and thereafter, moves downwardly or horizontally with respect to the opening 14 (Y-direction), for example.

The platform 13 is disposed on the roof of the treating block 3. As illustrated in FIG. 1, the platform 13 is provided higher in level than the treating block 3, i.e., above the treating block 3. The platform 13 may be provided on the treating block 3, i.e., may contact an upper face of the treating block 3. The platform 13 corresponds to a first carrier platform of the present invention.

The two substrate transport mechanisms TM1, TM2 each include two hands 21, a forward/rearward driving unit 23, and a lifting/lowering rotation driving unit 25. Each of the two hands 21 holds the substrate W. Moreover, each of the two hands 21 is movably attached to the forward/rearward driving unit 23. The forward/rearward driving unit 23 is capable of moving both of the two hands 21 into the carrier C simultaneously. Moreover, the forward/rearward driving unit 23 is capable of moving the two hands 21 forward and backward individually. Accordingly, the forward/rearward driving unit 23 is capable of moving one of the two hands 21 into the carrier C.

The lifting/lowering rotation driving unit 25 lifts, lowers, and rotates the forward/rearward driving unit 23 to thereby lift, lower, and rotate the two hands 21. In other words, the lifting/lowering rotation driving unit 25 allows the forward/rearward driving unit 23 to move in an upward/downward direction (Z-direction) and to rotate the forward/rearward driving unit 23 about a vertical axis AX1. The forward/rearward driving unit 23 and the lifting/lowering rotation driving unit 25 each include an electric motor. The two substrate transport mechanisms TM1, TM2 are fixed on a floor of the first ID block 2 individually so as not to move horizontally (especially, Y-direction).

Six substrate platforms PS1A to PS6A are disposed between the first ID block 2 and six treatment layers 3A to 3F, respectively, which are to be mentioned later. Each of the six substrate platforms PS1A to PS6A and six substrate platforms PS1B to PS6B mentioned later, for example, is capable of placing one or more substrates W thereon. The first substrate transport mechanism TM1 is capable of transporting a substrate W between the carrier C placed on the opener 9 and the six substrate platforms PS1A to PS6A. The second substrate transport mechanism TM2 is capable of transporting a substrate W between the carrier C placed on the opener 10 and the six substrate platforms PS1A to PS6A. Here, the first substrate transport mechanism TM1 is incapable of taking and accommodating the substrate W from and into the carrier C placed on the opener 10. Moreover, the second substrate transport mechanism TM2 is incapable of taking and accommodating the substrate W from and into the carrier C placed on the opener 9.

[Configuration of Treating Block 3]

The treating block 3 is connected to the first ID block 2 and the second ID block 4. That is, the treating block 3 is disposed between the two ID blocks 2, 4. The treating block 3 performs a coating treatment on the substrates W.

The treating block 3 includes six treatment layers 3A to 3F. The six treatment layers 3A to 3F are arranged to be laminated in the upward/downward direction (Z-direction). The six treatment layers 3A to 3F each include a third substrate transport mechanism TM3, a transportation space 27, a liquid-treating unit 28, and a heat-treatment unit 29. The six treatment layers 3A to 3F are configured in the same manner.

The third substrate transport mechanism TM3 is configured to transport the substrates W in each of the treatment layers 3A to 3F. The third substrate transport mechanism TM3 includes two hands 31, a forward/rearward driving unit 32, a rotation driving unit 33, a first moving mechanism 34, and a second moving mechanism 35.

Each of the two hands 31 holds the substrate W. Moreover, each of the two hands 31 is movably attached to the forward/rearward driving unit 32. The forward/rearward driving unit 32 moves the two hands 31 forward and backward individually. The rotation driving unit 33 causes the forward/rearward driving unit 32 to rotate about a vertical axis AX2. Accordingly, the orientation of each of the two hands 31 can be changed. The first moving mechanism 34 moves the rotation driving unit 33 in the forward/rearward direction (X-direction) as in FIG. 1. Accordingly, the forward/rearward driving unit 32 can be moved in the X-direction. The second moving mechanism 35 moves the first moving mechanism 34 in the upward/downward direction (Z-direction). Accordingly, the forward/rearward driving unit 32 can be moved in the Z-direction.

Each of the forward/rearward driving unit 32, the rotation driving unit 33, the first moving mechanism 34, and the second moving mechanism 35 includes an electric motor.

As illustrated in FIG. 2, the third substrate transport mechanism TM3 is disposed in the transportation space 27. The transportation space 27 is configured to extend in the horizontal direction (X-direction) linearly. The liquid-treating unit 28 and the heat-treatment unit 29 are disposed to sandwich the transportation space 27.

FIG. 3 is a right side view illustrating arrangement of the liquid-treating unit 28 of the treating block 3. Each of the six treatment layers 3A to 3F includes four liquid-treating units 28. The four liquid-treating units 28 are arranged in four lines in the horizontal direction and one level in the upward/downward direction, that is, the liquid-treating units 28 are arranged in 4 lines×1 levels. Of the four liquid-treating units 28, the two liquid-treating units 28 adjacent to the first ID block 2 are each a coating unit BARC. Moreover, the two liquid-treating units 28 adjacent to the second ID block 4 are each a coating unit RESIST. The coating unit BARC forms an antireflection film on the substrate W. The coating unit RESIST forms a resist film, such as a photoresist, on the substrate W.

As illustrated in FIG. 2, the liquid-treating unit 28 includes a holding rotation portion 37, nozzles 38, and a nozzle moving mechanism 39. The holding rotation portion 37 holds lower faces of the substrates W by, for example, vacuum adsorption and rotates the substrates W held by the holding rotation portion 37 about the vertical axis (Z-direction). The rotation is performed by an electric motor, for example. The nozzles 38 are configured to supply a coating solution (e.g., a solution for forming an anti-reflection film or a photoresist solution) to the substrates W. The nozzle moving mechanism 39 moves the nozzles 38 to any positions. The nozzle moving mechanism 39 includes an electric motor, for example.

FIG. 4 is a partial left side view illustrating arrangement of the heat treating unit 29 in the treating block 3. Each of the treatment layers 3A to 3F includes a plurality of heat-treatment units 29. The heat-treatment unit 29 performs a heat treatment, and includes a plate 41 (see FIG. 2) on which the substrate W is placed. For instance, the plate 41 is heated with a heater, and is cooled with a water-cooled mechanism.

The heat-treatment units 29 are arrangeable in five lines× three levels in the six treatment layers 3A to 3F. In FIG. 4, each of the six treatment layers 3A to 3F includes fourteen heat-treatment units 29. That is, each of the six treatment layers 3A to 3F includes three adhesion enhancing treatment units PAHP, two cooling units CP, and nine heating/cooling units PHP. It should be noted that, in the treating block 3, the numbers and types of the liquid-treating units 28, the heat-treatment units 29, and other treating units are variable where appropriate, for example. For instance, the treating unit may be an edge exposing unit EEW configured to expose a peripheral edge of the substrate W.

The adhesion enhancing treatment units PAHP are configured to apply an adhesion enhancing agent such as hexamethyldisilazane (HMDS) to substrates W and heats the resulting substrates W to thereby enhance adhesion between the substrates W and the antireflection films. The adhesion enhancing treatment units PAHP also have the function of cooling the substrates W after heating. The cooling units CP cool the substrates W. The heating/cooling units PHP sequentially perform heating and cooling in this order.

[Configuration of Second Indexer Block 4]

The second ID block 4 is connected to the treating block 3. The second ID block 4 includes two openers 45, 46 (see FIG. 6) and two substrate transport mechanisms TM4, TM5. The two openers 45, 46 provided in the second ID block 4 each include a carrier C placed thereon that is capable of accommodating a plurality of substrates W.

Similarly to the opener 9, the openers 45, 46 each include a platform 47 on which the carrier C is placed, an opening 48 through which the substrates W pass, a shutter (not shown) configured to open and close the opening 48 and to attach and detach the lid to and from the carrier body, and a shutter drive mechanism configured to drive the shutter. The shutter drive mechanism includes an electric motor. Here, the shutter detaches the lid from the carrier body, and thereafter, moves downwardly or horizontally with respect to the opening 48 (Y-direction), for example.

The platform 47 is disposed on the roof of the treating block 3. In FIG. 1, the platform 47 is provided higher in level than the treating block 3, i.e., above the treating block 3. The platform 47 may be provided on the coating block 3, i.e., may contact the treating block 3. The platform 47 corresponds to a second carrier platform of the present invention.

The substrate transport mechanisms TM4, TM5 each include two hands 21, a forward/rearward driving unit 23, and a lifting/lowering rotation driving unit 25. The substrate transport mechanisms TM4, TM5 are each configured in the same manner as that of the substrate transport mechanism TM1 (TM2).

Six substrate platforms PS1B to PS6B are disposed between the six treatment layers 3A to 3F and the second ID block 4. The fourth substrate transport mechanism TM4 is capable of transporting a substrate W between the carrier C placed on the opener 45 and the six substrate platforms PS1B to PS6B. The fifth substrate transport mechanism TM5 is capable of transporting a substrate W between the carrier C placed on the opener 46 and the six substrate platforms PS1B to PS6B. Here, the fourth substrate transport mechanism TM4 is incapable of taking and accommodating the substrate W from and into the carrier C placed on the opener 46. Moreover, the fifth substrate transport mechanism TM5 is incapable of taking and accommodating the substrate W from and into the carrier C placed on the opener 45.

[Carrier Buffer Device 8]

The substrate treating apparatus 1 includes a carrier buffer device 8 placed on or above the first ID block 2, the treating block 3 and the second ID block 4, for example. The carrier buffer device 8 includes a carrier transport mechanism 51 and a carrier storage shelf 53 (see FIG. 6).

Figure 5:
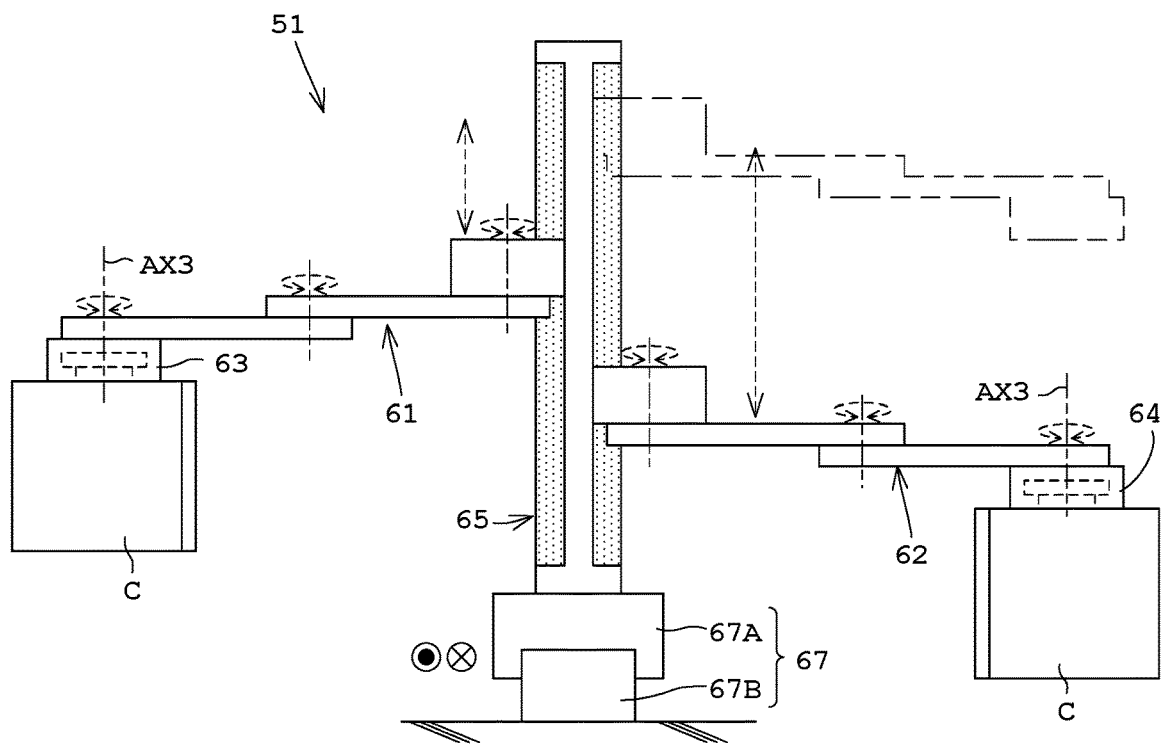
FIG. 5 illustrates a carrier transport mechanism.

Reference is made to FIG. 5. FIG. 5 illustrates the carrier transport mechanism 51. The carrier transport mechanism 51 includes two articulated arms 61, 62. A first articulated arm 61 includes a first end with a gripper 63, and a second articulated 62 includes a first end with a gripper 64. Moreover, the first articulated arm 61 includes a second end supported on a strut lifting/lowering driving unit 65 so as to be movable in the upward/downward direction. The second articulated arm 62 includes a second end supported on the lifting/lowering driving unit 65 so as to be movable in the upward/downward direction.

Each of the two grippers 63, 64 is configured to grasp a projection provided on a top face of the carrier C, for example. The two grippers 63, 64 each include an electric motor.

The two articulated arms 61, 62 each include one electric motor or two or more electric motors. The first articulated arm 61 is configured to cause the first gripper 63 to be rotatable to 360 degrees about a vertical axis AX3. The second articulated arm 62 is configured in the same manner as the first articulated arm 61. For instance, the first articulated arm 61 may be in charge of transporting the carrier C on the upper side (adjacent to the openers 10, 46) in FIG. 6, whereas the second articulated arm 62 may be in charge of transporting the carrier C on the lower side (adjacent to the openers 9, 45) in FIG. 6.

The lifting/lowering driving unit 65 is configured to cause the two articulated arms 61, 62 to be liftable individually. The lifting/lowering driving unit 65 includes an electric motor. The lifting/lowering driving unit 65 may include a belt and two or more pulleys, for example, for one articulated arm.

A forward/backward driving unit 67 includes a supporting portion 67A configured to support the lifting/lowering driving unit 65, a longitudinal portion 67B extending longitudinally in the forward/rearward direction (X-direction), and an electric motor (not shown). For instance, the longitudinal portion 67B may be a rail (guide rail) and the supporting portion 67A may be a carriage. In this case, the electric motor may cause the carriage (supporting portion 67A) to move along the rail (longitudinal portion 67B).

Moreover, the electric motor, the two or more pulleys, the belt, and the guide rail may be accommodated in the longitudinal portion 67B, and the supporting portion 67A may be fixed to the belt, for example. In this case, the electric motor may cause the pulleys to rotate to move the belt on the pulleys, whereby supporting portion 67A is moved along the guide rail.

Figure 6:
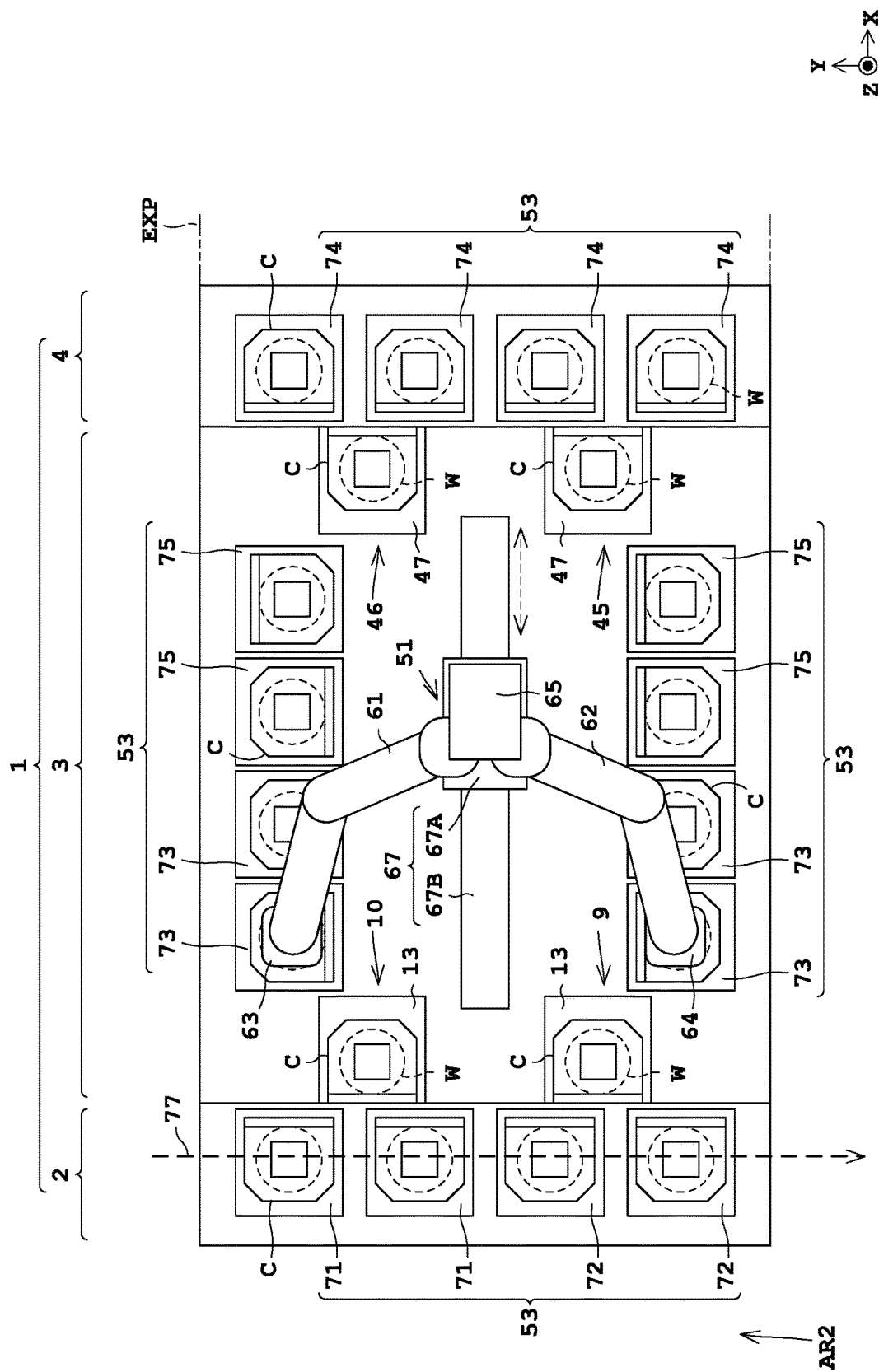
FIG. 6 is a plan view of a carrier buffer device.

Reference is made to FIG. 6. The carrier storage shelf 53 includes input ports 71, output ports 72, untreated substrate carrier shelves 73, empty carrier shelves 74, and treated substrate carrier shelves 75. The input ports 71 are each a shelf for receiving the carrier C where untreated substrates W are accommodated from an external transport mechanism OHT (overhead hoist transport). The external transport mechanism OHT transports a carrier C in the factory. The term "untreated" means the condition where the treating block 3 performs no treatment. As illustrated in FIGS. 1 and 6, the input port 71 is provided on the ID block 2, i.e., on the roof of the ID block 2. A rail 77 for the external transport mechanism OHT is provided above the ID block 2. The external transport mechanism OHT transports a carrier C to one of the two input ports 71.

Moreover, as illustrated in FIG. 6, the untreated substrate carrier shelves 73, and the treated substrate carrier shelves 75 are arranged along the longitudinal portion 67B in a longitudinal direction of the substrate treating apparatus 1. The untreated substrate carrier shelf 73 accommodates a carrier C which is placed on the input port 71, the carrier C being not transported to either of the two platforms 13, and accommodating untreated substrates W. The empty carrier shelf 74 accommodates a carrier C from which all the substrates W are taken out on the platform 13, the carrier C being not transported to either of the two platforms 47. The empty carrier shelf 74 is disposed on the second ID block 4, i.e., on the roof of the second ID block 4. The treated substrate carrier shelf 75 accommodates a carrier C accommodating the treated substrates W and not transported to either of the two output ports 72. The term "treated" means the condition where the treating block 3 performs any treatment.

The output port 72 is a shelf for delivering a carrier C where the treated substrates W are accommodated to the external transport mechanism OHT. As illustrated in FIGS.

1 and 6, the output port 72 is provided on the ID block 2, i.e., on the roof of the ID block 2. The carrier transport mechanism 51 allows a carrier C to move freely among the platforms 13, 47 and the shelves 71 to 75.

Moreover, as illustrated in FIGS. 1 and 6, the platform 13 and the opening 14 (openers 9, 10) are disposed adjacent to the treating block 3, and the platform 47 and the opening 48 (openers 45, 46) are disposed adjacent to the treating block 3. In other words, the platform 13 and the platform 47 are disposed so as to face each other. Accordingly, the platform 13 and the platform 47 face the carrier transport mechanism 51, whereby the carrier transport mechanism 51 can transport the carrier C easily. Moreover, if the platform is disposed opposite to the treating block 3 (see the arrow AR2 in FIG. 6) across the first ID block 2 in a currently-used manner, the platform 13 protrudes, for example. In contrast to this, since the platform 13 and the platform 47 are disposed so as to face each other, protrusion of the platform 13 can be prevented. As a result, reduction in footprint of the substrate treating apparatus 1 is obtainable.

The carrier transport mechanism 51 includes the two-paired articulated arms and grippers. Alternatively, one-paired articulated arm and gripper, or three or more paired articulated arms and grippers may be provided. Moreover, the lifting/lowering driving unit 65 may be configured to be rotatable about a vertical axis with respect to the supporting portion 67A. Moreover, the rail 77 may pass an area other than the area above the first ID block 2. In this case, an input port 71 and an output port 72 are provided at a position on the apparatus 1 where the rail passes above the substrate treating apparatus 1. The number and types of the carrier storage shelves 53 are variable where appropriate.

Moreover, as illustrated in FIG. 2, the substrate treating apparatus 1 includes one or more control units 79 and an operation unit 80. Each of the control units 79 includes, for example, a central processing unit (CPU). The control units 79 control components of the substrate treating apparatus 1. The operation unit 80 includes a display unit (e.g., liquid crystal monitor), a memory unit, and an input unit. The memory unit includes, for example, at least one of a read-only memory (ROM), random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1.

<Operation of Substrate Treating Apparatus 1>

An operation of the substrate treating apparatus 1 will now be described. It should be noted that a plurality of processes performed in the substrate treating apparatus 1 is one example, and an operator selects a required process from them. Reference is made to FIG. 1. The external transport mechanism OHT transports a carrier C to the input ports 71 provided on the first ID block 2. The carrier transport mechanism 51 transports the carrier C from the input port 71 to the platform 13 of the opener 9, for example. The shutter of the opener 9 opens the opening 14 while removing and holding the lid of the carrier C.

[Step S01] First ID Block 2

The first ID block 2 takes a substrate W from the carrier C placed on the carrier platform 13 of one of the two openers 9, 10, and sends the taken substrate W to one of the six treatment layers 3A to 3F. For instance, the first substrate transport mechanism TM1 takes a substrate W from the carrier C placed on the platform 13 of the opener 9. The first substrate transport mechanism TM1 transports the taken substrate W to the substrate platform PS1A, for example. Moreover, the first substrate transport mechanism TM1 transports the taken substrate W to the treatment layers 3A to 3F in substantially the even manner, for example. Here, the second substrate transport mechanism TM2 takes a substrate W from the carrier C placed on the platform 13 of the opener 10.

When all the substrates W are taken from the carrier C, the opener 9 closes the opening 14 with the shutter while attaching the lid to the carrier C. Thereafter, the carrier transport mechanism 51 replaces the empty carrier C, from which the substrates W are taken out, by another carrier C accommodating untreated substrates W. Thereafter, the carrier transport mechanism 51 transports the empty carrier C to the platform 47 of the opener 45, for example. If the empty carrier C is incapable of being transported to either the opener 45 or 46, the carrier transport mechanism 51 transports the empty carrier C to the empty carrier shelf 74.

[Step S02] Treating Block 3

The treatment layers 3A to 3F of the treating block 3 each perform a coating treatment on the sent substrate W, and sends the substrate W subjected to the coating treatment to the second ID block 4. Detailed description is as under.

For instance, in the treatment layer 3A of the treating block 3, the third substrate transport mechanism TM3 receives a substrate W from the substrate platform PS1A. The third substrate transport mechanism TM3 transports the received substrate W to an adhesion enhancing treatment unit PAHP, a cooling unit CP, and a coating unit BARC, illustrated in FIG. 3 or 4, in this order. Thereafter, the third substrate transport mechanism TM3 transports the substrate W on which an antireflection film is formed by the coating unit BARC, to a heating/cooling unit PHP, a cooling unit CP, a coating unit RESIST, and a heating/cooling unit PHP in this order. The third substrate transport mechanism TM3 transports the substrate W on which a resist film is formed by the coating unit RESIST to the substrate platform PS1B. The treatment layers 3B to 3F each perform the coating treatment on the sent substrate W similarly to the treatment layer 3A. It should be noted that a process by the adhesion enhancing treatment unit PAHP is omittable.

[Step S03] Second ID Block 4

The second ID block 4 returns the substrate W, treated in any of the treatment layers 3A to 3F, to a carrier C placed on the platform 47 of either of the two openers 45, 46. Detailed description is as under. The carrier C on the platform 47 includes the opening kept in an opened state by the opener 45. The fourth substrate transport mechanism TM4 receives the substrate W from the substrate platform PS1B, and returns the received substrate W to the carrier C placed on the platform 47 of the opener 45. Here, the substrate W is returned to the carrier C where the substrate W was accommodated prior to the coating treatment. In other words, the substrate W is returned to the first carrier C. Moreover, the substrate W is returned to the carrier C placed on the platform 47 of the opener 46 with use of the fifth substrate transport mechanism TM5.

When all the treated substrates W are accommodated in the carrier C, the opener 45 closes the opening 48 while attaching the lid to the carrier C. The carrier transport mechanism 51 transports the carrier C where the treated substrates W are accommodated from the platform 47 of the opener 45 to the output port 72. Thereafter, the external transport mechanism OHT transports the carrier C from the output port 72 to a next target.

Figure 7:
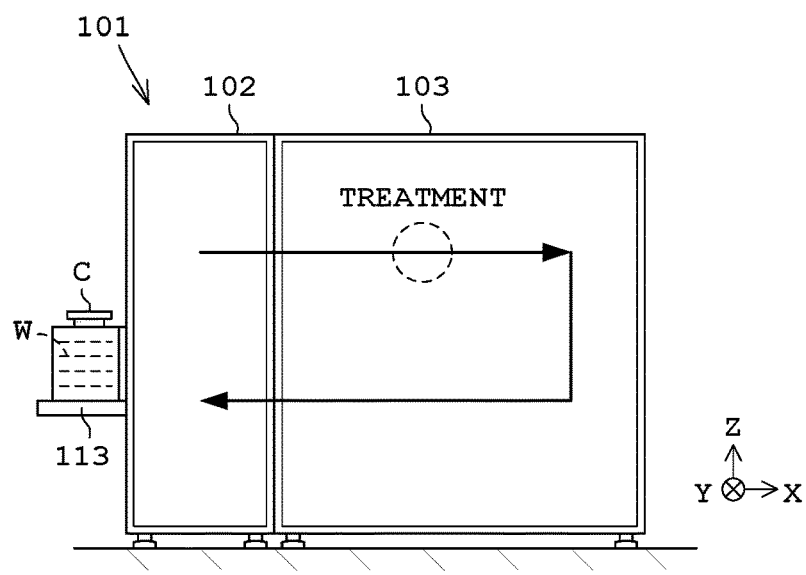
FIG. 7 illustrates operation of a currently-used substrate treating apparatus.
Figure 8:
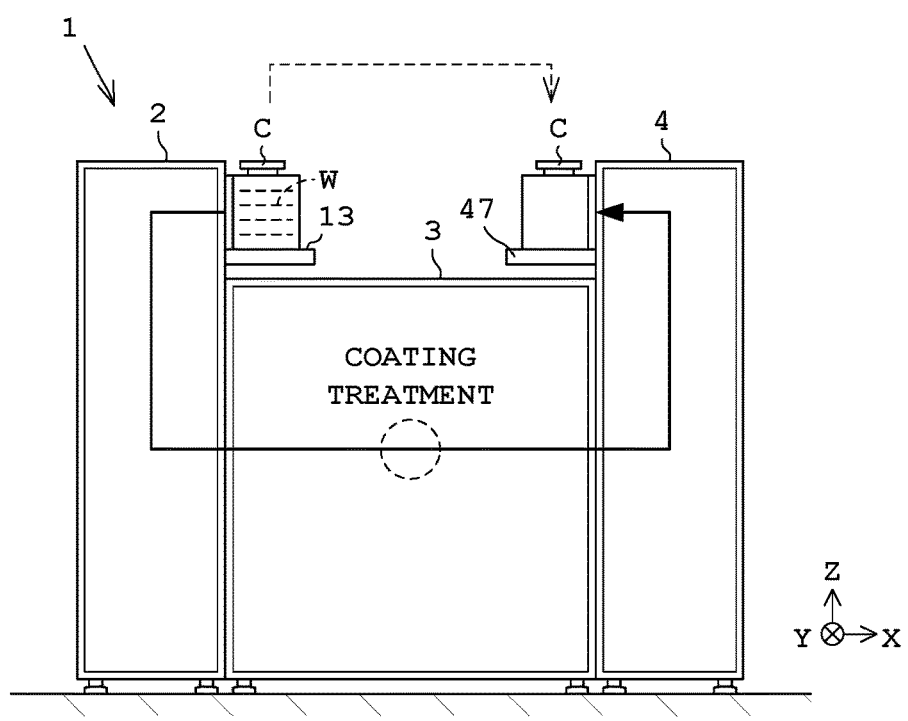
FIG. 8 illustrates operation of the substrate treating apparatus according to the first embodiment.

The following describes effects of the present embodiment. FIG. 7 illustrates operation of a currently-used substrate treating apparatus. FIG. 8 illustrates operation of the treating block 3 including a single treatment layer. In FIG. 7, an ID block 102 of a currently-used substrate treating apparatus 101 performs a substrate transportation process including a sending step and a return step. The sending step is a process in which a substrate W is taken from the carrier C placed on the carrier platform 113, and the taken substrate W is transported to a treating block 103. Moreover, the return step is a process in which the substrate W treated in the treating block 103 is received from the treating block 103, and the received substrate W is returned to the carrier C placed on the carrier platform 113 described above.

According to this embodiment, the first ID block 2 takes a substrate W from the carrier C placed on the carrier platform 13, and sends the taken substrate W to one of the six treatment layers 3A to 3F (see FIG. 1) (sending step). Moreover, the second ID block 4 returns the substrate W, sent from each of the six treatment layers 3A to 3F, to a carrier C placed on the platform 47 (return step). In other words, substrate transportation (sending step and return step) for loading and unloading the substrate W to and from the carrier C is shared with the two ID blocks 2, 4 as illustrated in FIG. 8. This allows the first ID block 2 to transport many substrates W to the six treatment layers 3A to 3F (see FIG. 1) arranged in the upward/downward direction more rapidly. Moreover, this simultaneously allows the second ID block 4 to transport many substrates W, having been sent from the six treatment layers 3A to 3F arranged in the upward/downward direction, to the carrier C more rapidly. As a result, a throughput of the substrate treating apparatus 1 can be enhanced.

Moreover, the substrate treating apparatus 1 includes the carrier transport mechanism 51 configured to transport a carrier C between the platform 13 and the platform 47 as in FIG. 1. For instance, when all the substrates W are taken from the carrier C placed on the platform 13, the carrier transport mechanism 51 is capable of transporting the carrier C placed on the platform 13 to the platform 47 in order to return the substrates W to the carrier C.

Moreover, the carrier transport mechanism 51 is mounted on the single treating block 3. The currently-used carrier transport mechanism is disposed horizontally with respect to the first ID block 2. According to this embodiment, the carrier transport mechanism 51 is mounted on the single treating block 3. Accordingly, an installation area of the currently-used carrier transport mechanism disposed horizontally with respect to the first ID block 2 can be decreased. In other words, reduction in footprint of the substrate treating apparatus 1 is obtainable.

Moreover, the substrate treating apparatus 1 includes the carrier storage shelf 53 mounted on the first ID block 2, the treating block 3, and the second ID block 4. The carrier transport mechanism 51 transports a carrier C among the platforms 13, 47 and the carrier storage shelf 53. A currently-used carrier storage shelf 53 is disposed horizontally with respect to the first ID block 2. With the configuration of this embodiment, the carrier storage shelf 53 is mounted on the treating block 3, for example. Accordingly, an installation area of the currently-used carrier storage shelf disposed horizontally with respect to the first ID block 2 can be decreased. In other words, reduction in footprint of the substrate treating apparatus 1 is obtainable.

Second Embodiment

A second embodiment of the present invention will now be described with reference to the drawings. Here, the description common to that of the first embodiment is to be omitted.

In the first embodiment, the six treatment layers 3A to 3F each form an antireflection film on the substrate W, and thereafter form a resist film on the substrate W. In other words, the six treatment layers 3A to 3F perform the same coating treatment. In contrast to this, in the second embodiment, one treatment layer may perform a first coating treatment on a substrate W, and another treatment layer may perform a second coating treatment on the substrate W subjected to the first coating treatment.

Figure 9:
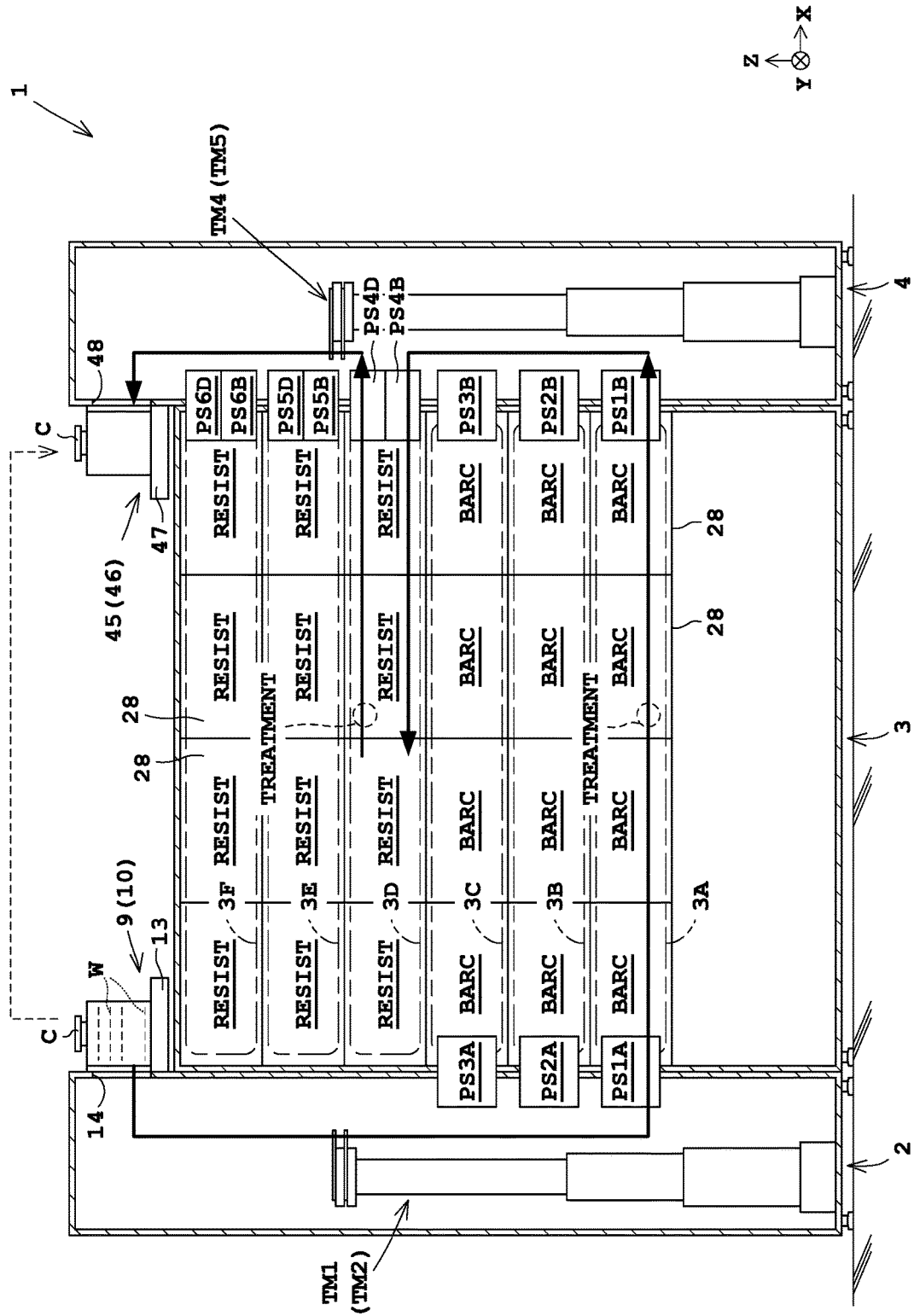
FIG. 9 is a right side view of a substrate treating apparatus according to a second embodiment and illustrates operation of the substrate treating apparatus.

FIG. 9 is a right side view illustrating arrangement of the liquid-treating unit 28 of the treating block 3 according to the second embodiment. In the treating block 3, three lower treatment layers 3A to 3C each perform a first coating treatment to form an antireflection film, and three upper treatment layers 3D to 3F each perform a second coating treatment to form a resist film.

Here in FIG. 9, substrate platforms PS4B to PS6B for sending and substrate platforms PS4D to PS6D for return are disposed between the second ID block 4 and the three treatment layers 3D to 3F.

<Operation of Substrate Treating Apparatus 1>

An operation of the substrate treating apparatus 1 according to this embodiment will now be described. Reference is made to FIG. 9.

[Step S11] First ID Block 2

The first ID block 2 takes a substrate W from the carrier C placed on the platform 13 of one of the two openers 9, 10, and sends the taken substrate W to one of the three treatment layers 3A to 3C. For instance, the first substrate transport mechanism TM1 takes a substrate W from the carrier C placed on the platform 13 of the opener 9. The first substrate transport mechanism TM1 transports the taken substrate W to the substrate platform PS1A. Moreover, the first substrate transport mechanism TM1 transports the taken substrate W to the treatment layers 3A to 3C, for example, in substantially the even manner.

Here, after the first substrate transport mechanism TM1 takes all the substrates W from the carrier C placed on the opener 9, the carrier transport mechanism 51 transports the empty carrier C to the platform 47 of the opener 45, for example (see the arrow by dotted lines between the carrier C of the platform 13 and the carrier C of the platform 47 in FIG. 9).

[Step S12] Treatment Layers 3A to 3C in Treating Block 3 (First Coating Treatment)

The treatment layers 3A to 3C of the treating block 3 each perform the first coating treatment (e.g., antireflection film formation) on the sent substrate W, and sends the substrate W subjected to the first coating treatment to the second ID block 4. Detailed description is as under.

For instance, in the treatment layer 3A of the treating block 3, the third substrate transport mechanism TM3 in FIG. 1 receives a substrate W from the substrate platform PS1A. The third substrate transport mechanism TM3 transports the received substrate W to an adhesion enhancing treatment unit PAHP, a cooling unit CP, and a coating unit BARC in this order. In the coating unit BARC, the antireflection film is formed on the substrate W. The third substrate transport mechanism TM3 transports the substrate W on which the antireflection film is formed in the coating unit BARC to the substrate platform PS1B. The treatment layers 3B, 3C each perform the first coating treatment on the sent substrate W similarly to the treatment layer 3A.

[Step S13] Second ID Block 4

The second ID block 4 sends the substrate W, treated in the treatment layer 3A, from the treatment layer 3A to the treatment layer 3D where the second coating treatment is performed. That is, one of the two substrate transport mechanisms TM4, TM5 transports the substrate W from the substrate platform PS1B to the substrate platform PS4B in FIG. 9. Here, the substrate W subjected to the first coating treatment in the treatment layer 3B is sent to the treatment layer 3E. Moreover, the substrate W subjected to the first coating treatment in the treatment layer 3C is sent to the treatment layer 3F.

[Step S14] Treatment Layers 3D to 3F in Treating Block 3 (Second Coating Treatment)

The treatment layers 3D to 3F of the treating block 3 each perform the second coating treatment (e.g., resist film formation) on the sent substrate W, and returns the substrate W subjected to the second coating treatment to the second ID block 4. Detailed description is as under.

In the treatment layer 3D of the treating block 3, the third substrate transport mechanism TM3 in FIG. 1 receives a substrate W from the substrate platform PS4B. As illustrated in FIGS. 4, 9, the third substrate transport mechanism TM3 transports the received substrate W to a heating/cooling unit PHP, a cooling unit CP, a coating unit RESIST, and a heating/cooling unit PHP in this order. The third substrate transport mechanism TM3 sends the substrate W on which a resist film is formed by the coating unit RESIST to the substrate platform PS4D. The treatment layers 3E, 3F each perform the second coating treatment on the sent substrate W similarly to the treatment layer 3D.

[Step S15] Second ID Block 4

The second ID block 4 returns the substrate W, treated in any of the treatment layers 3D to 3F, to a carrier C placed on the platform 47 of either of the two openers 45, 46. Detailed description is as under. The carrier C on the platform 47 includes the opening kept in an opened state by the opener 45. The fourth substrate transport mechanism TM4 receives a substrate W from the substrate platform PS4D, and returns the received substrate W to the carrier C placed on the platform 47 of the opener 45. Here, the substrate W is returned to the carrier C where the substrate W was accommodated prior to the coating treatment. Moreover, the substrate W is returned to the carrier C placed on the platform 47 of the opener 46 with use of the fifth substrate transport mechanism TM5.

<Other Operational Examples>

Figure 10:
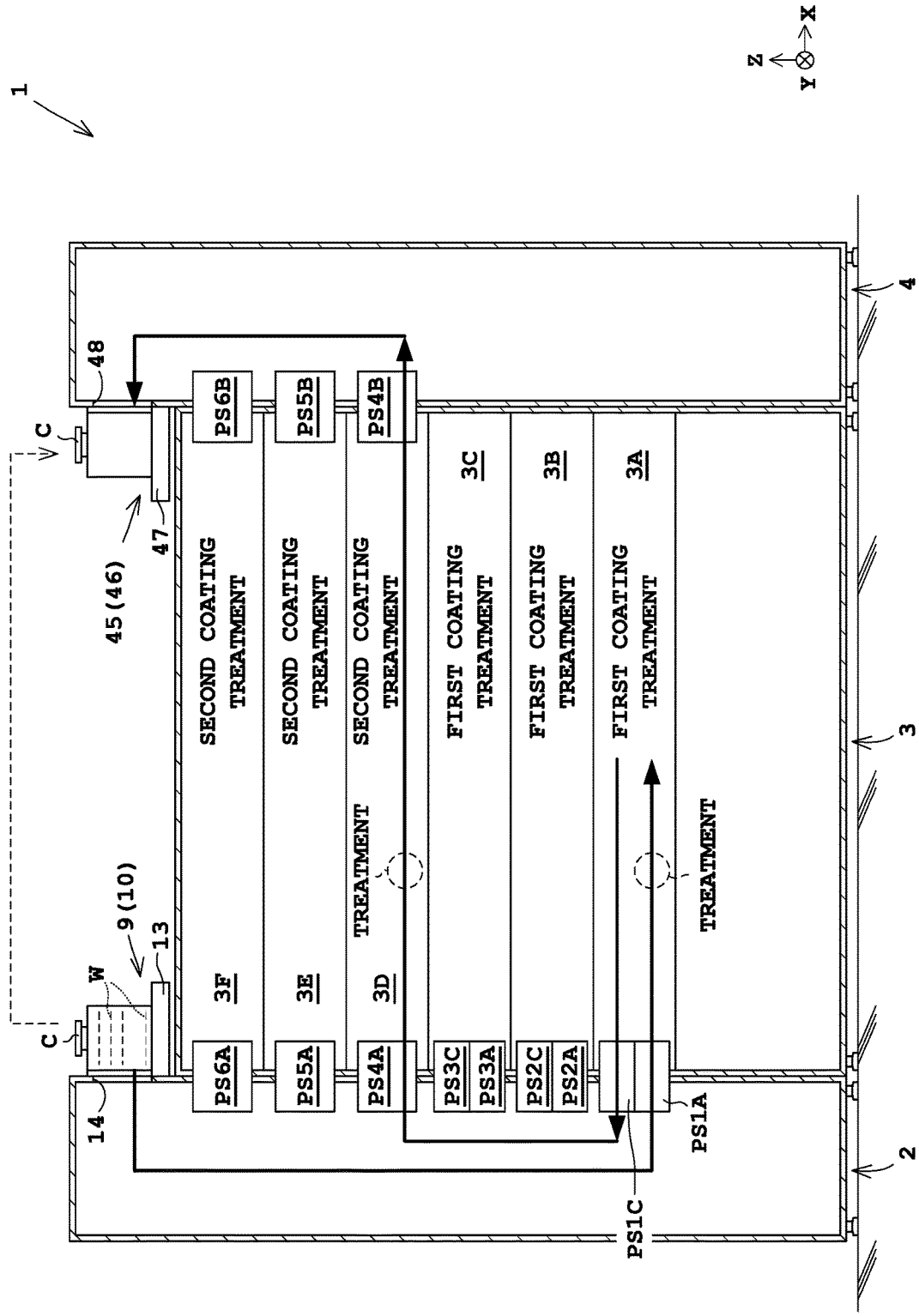
FIG. 10 illustrates operation of a substrate treating apparatus according to one modification of the second embodiment.

It should be noted that the treating block 3 in FIG. 9 may operate in such a manner as in FIG. 10. In FIG. 10, substrate platforms PS1A to PS3A for sending and substrate platforms PS1C to PS3C for return are disposed between the first ID block 2 and the three treatment layers 3A to 3C.

The first ID block 2 takes a substrate W from the carrier C placed on the platform 13 of one of the two openers 9, 10, and sends the taken substrate W to one of the three treatment layers 3A to 3C. The treatment layers 3A to 3C of the treating block 3 each perform the first coating treatment (e.g., antireflection film formation) on the sent substrate W, and returns the substrate W subjected to the first coating treatment to the first ID block 2. For instance, in the treatment layer 3A, the third substrate transport mechanism TM3 receives a substrate W from the substrate platform PS1A. Then, after the first coating treatment, the third substrate transport mechanism TM3 sends the substrate W, subjected to the first coating treatment, to the substrate platform PS1C.

The first ID block 2 sends the substrate W, treated in the treatment layer 3A, from the treatment layer 3A to the treatment layer 3D where the second coating treatment is performed. The treatment layers 3D to 3F of the treating block 3 each perform the second coating treatment (e.g., resist film formation) on the sent substrate W, and sends the substrate W subjected to the second coating treatment to the second ID block 4. The second ID block 4 returns the substrate W, treated in any of the treatment layers 3D to 3F, to a carrier C placed on the platform 47 of either of the two openers 45, 46.

According to this embodiment, in the configuration where the treatment layer 3A and the treatment layer 3D perform different treatments on the substrate W in order, for example, substrate transportation for loading and unloading the substrate W with respect to the carrier C and substrate transportation between the treatment layers can be shared with the two ID blocks 2, 4.

Third Embodiment

A third embodiment of the present invention will now be described with reference to the drawings. Here, the description common to that of the first and second embodiments is to be omitted.

In the first embodiment, the six treatment layers 3A to 3F each form an antireflection film on the substrate W, and thereafter form a resist film on the substrate W. In other words, the six treatment layers 3A to 3F perform the same coating treatment. In contrast to this, in the third embodiment, one treatment layer may perform a first coating treatment on a substrate W, and another treatment layer may perform a second coating treatment on the substrate W subjected to the first coating treatment. Moreover, another treatment layer may perform a third coating treatment on the substrate W on which the second coating treatment is performed.

Figure 11:
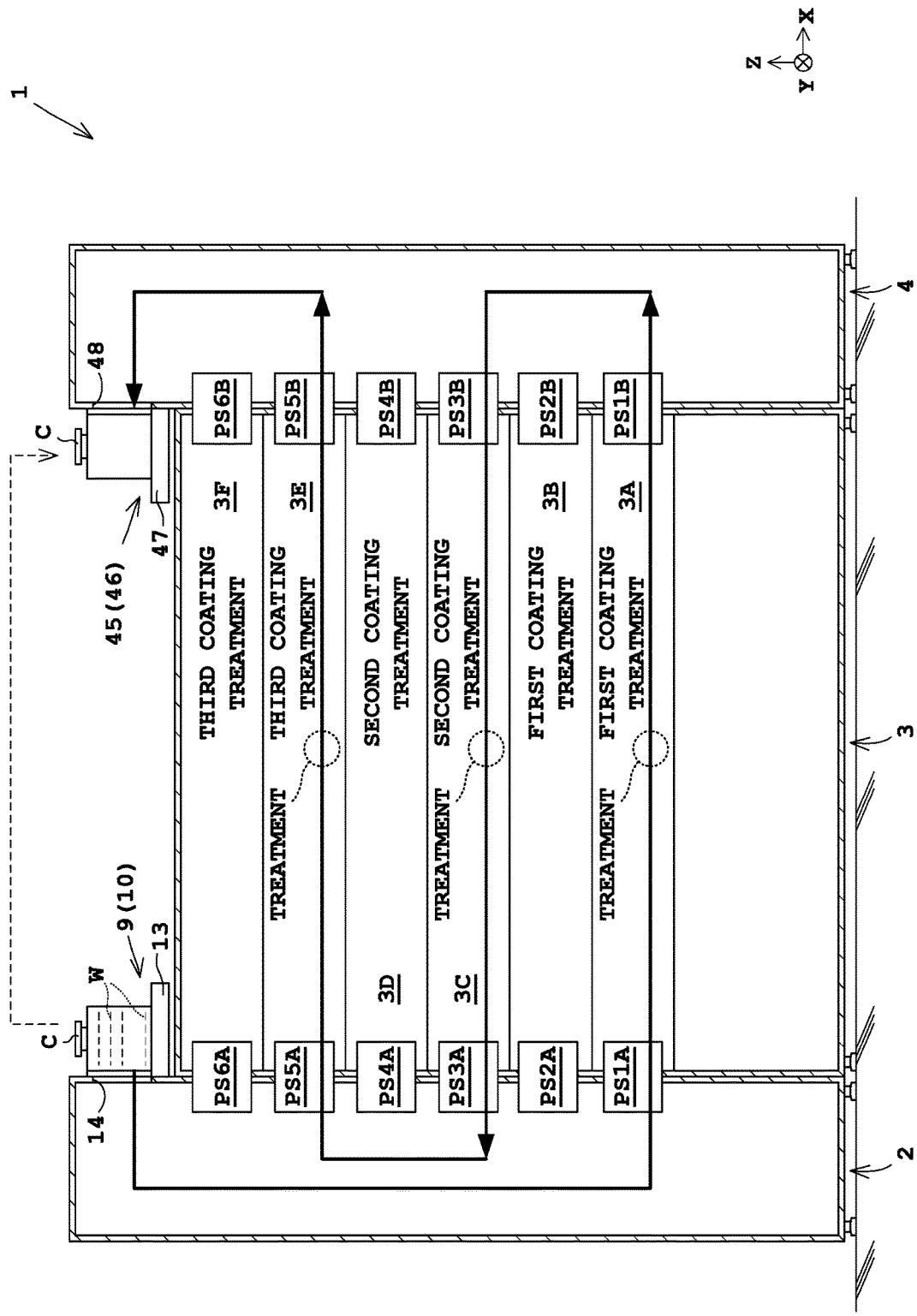
FIG. 11 is a right side view of a substrate treating apparatus according to a third embodiment and illustrates operation of the substrate treating apparatus.

FIG. 11 is a right side view illustrating arrangement of the liquid-treating unit 28 of the treating block 3 according to the third embodiment. In the treating block 3, two lower treatment layers 3A, 3B each perform a first coating treatment to form an antireflection film, and two middle treatment layers 3C, 3D each perform a second coating treatment to form a resist film. The upper two treatment layer 3E, 3F each perform a third coating treatment to form a resist cover film. The coating unit for forming the resist cover film includes a holding rotation portion 37, nozzles 38, and a nozzle moving mechanism 39, for example (see FIG. 2). Here, the resist cover film is, for example, a film with repellency. Moreover, the first coating treatment, the second coating treatment, and the third coating treatment may each form a film as under. That is, in the first coating treatment, an underlayer film (spin on carbon (SOC)) is formed. In the second coating treatment, a middle film (spin on glass (SOG)) is formed. In the third coating treatment, a resist film is formed.

<Operation of Substrate Treating Apparatus 1>

An operation of the substrate treating apparatus 1 according to this embodiment will now be described. Reference is made to FIG. 11.

[Step S21] First ID Block 2

The first ID block 2 takes a substrate W from the carrier C placed on the platform 13 of one of the two openers 9, 10 (see FIG. 6), and sends the taken substrate W to one of the two treatment layers 3A, 3B. For instance, the first substrate transport mechanism TM1 takes a substrate W from the carrier C placed on the platform 13 of the opener 9. The first substrate transport mechanism TM1 transports the taken substrate W to the substrate platform PS1A.

[Step S22] Treatment Layers 3A, 3B in Treating Block 3 (First Coating Treatment)

The treatment layers 3A, 3B of the treating block 3 each perform the first coating treatment (e.g., antireflection film formation) on the sent substrate W, and sends the substrate W subjected to the first coating treatment to the second ID block 4. For instance, in the treatment layer 3A of the treating block 3, the third substrate transport mechanism TM3 in FIG. 1 receives a substrate W from the substrate platform PS1A. The third substrate transport mechanism TM3 transports the received substrate W to an adhesion enhancing treatment unit PAHP, a cooling unit CP, and a coating unit BARC in this order. The third substrate transport mechanism TM3 transports the substrate W on which the antireflection film is formed in the coating unit BARC to the substrate platform PS1B.

[Step S23] Second ID Block 4

The second ID block 4 sends the substrate W, treated in the treatment layer 3A, from the treatment layer 3A to the treatment layer 3C where the second coating treatment is performed. That is, one of the two substrate transport mechanisms TM4, TM5 transports the substrate W from the substrate platform PS1B to the substrate platform PS3B in FIG. 11. Here, the substrate W subjected to the first coating treatment in the treatment layer 3B is sent to the treatment layer 3D.

[Step S24] Treatment Layers 3C, 3D in Treating Block 3 (Second Coating Treatment)

The treatment layers 3C, 3D of the treating block 3 each perform the second coating treatment (e.g., resist film formation) on the transported substrate W, and transports the substrate W subjected to the second coating treatment to the first ID block 2. For instance, in the treatment layer 3C of the treating block 3, the third substrate transport mechanism TM3 in FIG. 1 receives a substrate W from the substrate platform PS3B. The third substrate transport mechanism TM3 transports the received substrate W to a heating/cooling unit PHP, a cooling unit CP, a coating unit RESIST, and a heating/cooling unit PHP in this order. The third substrate transport mechanism TM3 transports the substrate W on which a resist film is formed by the coating unit RESIST to the substrate platform PS3A.

[Step S25] First ID Block 2

The first ID block 2 sends the substrate W, treated in the treatment layer 3C, from the treatment layer 3C to the treatment layer 3E where the third coating treatment is performed. That is, one of the two substrate transport mechanisms TM1, TM2 transports the substrate W from the substrate platform PS3A to the substrate platform PS5A in FIG. 11. Here, the substrate W subjected to the second coating treatment in the treatment layer 3D is sent to the treatment layer 3F.

[Step S26] Treatment Layers 3E, 3F in Treating Block 3 (Third Coating Treatment)

The treatment layers 3E, 3F of the treating block 3 each perform the third coating treatment (e.g., resist cover film formation) on the sent substrate W, and transports the substrate W subjected to the third coating treatment to the second ID block 4. For instance, in the treatment layer 3E of the treating block 3, the third substrate transport mechanism TM3 in FIG. 1 receives a substrate W from the substrate platform PS5A. The third substrate transport mechanism TM3 transports the received substrate W to a coating unit where the resist cover film is formed, and a heating/cooling unit PHP in this order. The third substrate transport mechanism TM3 transports the substrate W, on which a resist cover film is formed, to the substrate platform PS5B. Here, the substrate W treated in the heating/cooling unit PHP may be transported to the edge exposing unit EEW, and the substrate W treated in the edge exposing unit EEW may be transported to the substrate platform PS5B.

[Step S27] Second ID Block 4

The second ID block 4 returns the substrate W, treated in one of the treatment layers 3E, 3F, to a carrier C placed on the platform 47 of one of the two openers 45, 46 (see FIG. 6). Detailed description is as under. The fourth substrate transport mechanism TM4 receives the substrate W from the substrate platform PS5B, and returns the received substrate W to the carrier C placed on the platform 47 of the opener 45.

According to this embodiment, treatment layers 3A to 3F each send the substrate W from the ID block as a start of sending the substrate W to the opposite ID block (e.g., from the first ID block 2 to the second ID block 4). The substrate platform PS1A to PS6A used for substrate transportation is disposed between the treatment layers 3A to 3F and the first ID block 2. Moreover, the substrate platforms PS1B to PS6B are disposed between the treatment layers 3A to 3F and the second ID block 4. When the substrate W is returned to the ID block as the start of sending the substrate W (such as when the substrate W sent from the first ID block 2 is returned to the first ID block 2), two types of substrate platforms, i.e., a substrate platform for sending and a substrate platform for return, have to be disposed adjacent to one of the ID blocks (see, for example, the substrate platforms PS2A, PS2C in FIG. 10). Accordingly, the numbers of substrates W placeable on the substrate platform for sending and the substrate platform for return become limitative. However, the substrate is sent from the ID block as the start of sending the substrate W to the ID block opposite thereto, ensuring the number of substrates W placeable on the substrate platforms. In addition, since the two ID blocks 2, 4 perform alternate transportation, the two ID blocks 2, 4 are capable of separating substrate transportation between the layers substantially evenly.

Figure 12A:
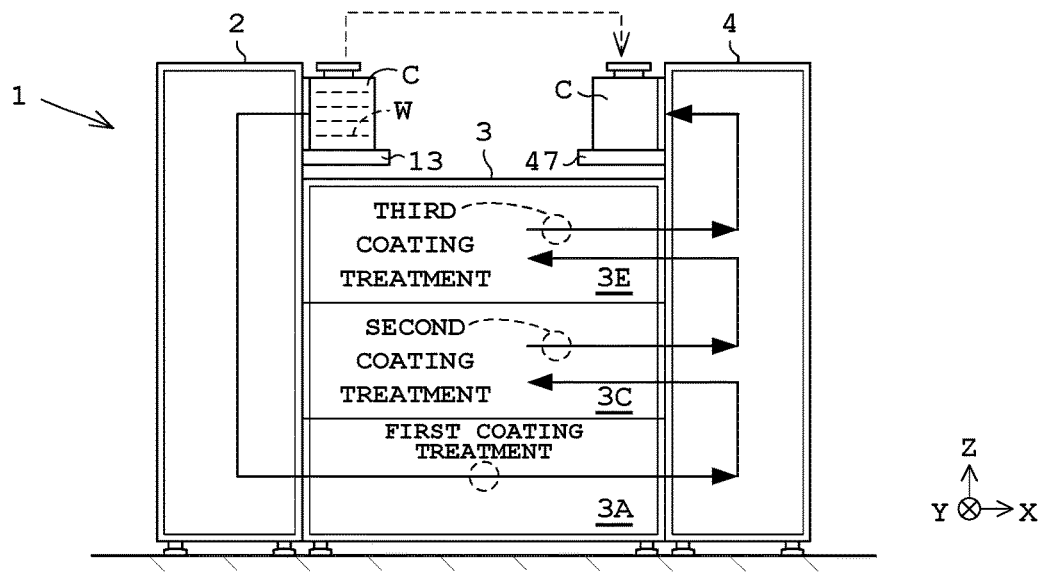
FIGS. 12A to 12C each illustrate operation of a substrate treating apparatus according to one modification of the third embodiment.
Figure 12B:
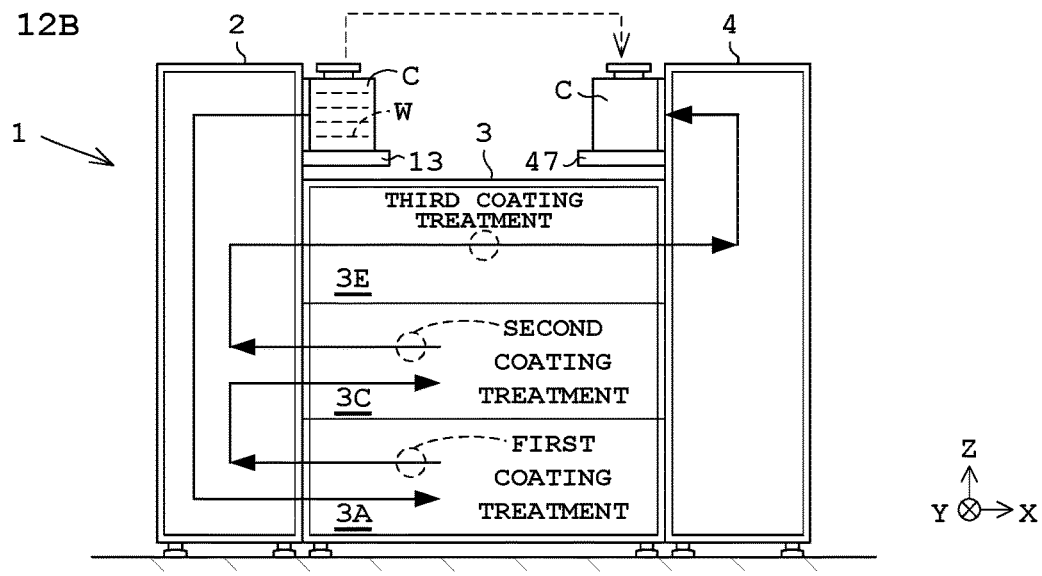
Figure 12C:
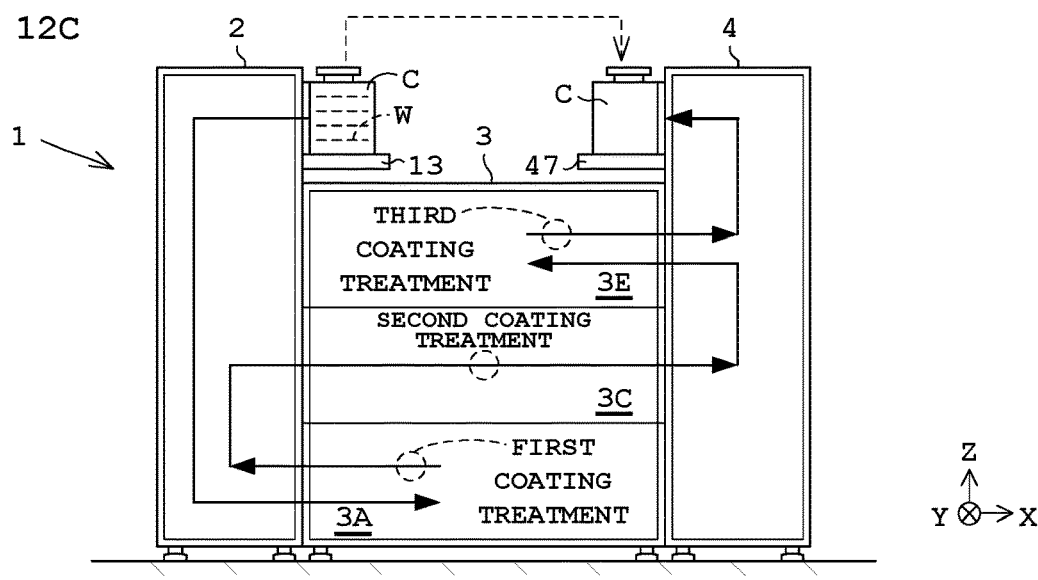

The following describes other operational examples with reference to FIGS. 12A to 12C. Here in FIGS. 12A to 12C, the treating block 3 includes three treatment layers 3A, 3C, 3E. Moreover, as described above, an antireflection film is formed on the substrate W in the treatment layer 3A, and a resist film is formed on the substrate W in the treatment layer 3C, for example. Moreover, a resist cover film is formed on the substrate W in the treatment layer 3E, for example.

<Additional Operational Example 1>

Reference is made to FIG. 12A. The first ID block 2 takes a substrate W from the carrier C on the platform 13, and transports the taken substrate W to the treatment layer 3A. The substrate W transported into the treatment layer 3A is transported to the second ID block 4, the treatment layer 3C, the second ID block 4, the treatment layer 3E, and the second ID block 4, in this order. Then, the second ID block 4 accommodates the substrate W, treated in the treatment layer 3E, into the carrier C on the platform 47. Each of the three treatment layers 3A, 3C, 3E performs a preset coating treatment.

<Additional Operational Example 2>

Reference is made to FIG. 12B. The first ID block 2 takes a substrate W from the carrier C on the platform 13, and transports the taken substrate W to the treatment layer 3A. The substrate W transported into the treatment layer 3A is transported to the first ID block 2, the treatment layer 3C, the first ID block 2, the treatment layer 3E, and the second ID block 4, in this order. Then, the second ID block 4 accommodates the substrate W, treated in the treatment layer 3E, into the carrier C on the platform 47. Each of the three treatment layers 3A, 3C, 3E performs a preset coating treatment.

According to the additional operational examples 1 and 2, in the configuration where the treatment layers 3A, 3C, 3E perform different treatments on the substrate W in order, for example, the two ID blocks 2, 4 are capable of separating substrate transportation for loading and unloading the substrate W with respect to the carrier C and substrate transportation between the treatment layers.

<Other Operational Example 3>

Reference is made to FIG. 12C. The first ID block 2 takes a substrate W from the carrier C on the platform 13, and transports the taken substrate W to the treatment layer 3A. The substrate W transported into the treatment layer 3A is transported to the first ID block 2, the treatment layer 3C, the second ID block 4, the treatment layer 3E, and the second ID block 4, in this order. Then, the second ID block 4 accommodates the substrate W, treated in the treatment layer 3E, into the carrier C on the platform 47. Each of the three treatment layers 3A, 3C, 3E performs a preset coating treatment.

In such an operational example, the first ID block 2 transports the substrate W between the two treatment layers 3A, 3C, whereas the second ID block 4 transports the substrate W between the two treatment layers 3C, 3D. According to this operational example, in the configuration where the treatment layers 3A, 3C, 3E perform different treatments on the substrate W in order, for example, the two ID blocks 2, 4 are capable of evenly separating substrate transportation for loading and unloading the substrate W with respect to the carrier C and substrate transportation between the treatment layers. Especially, substrate transportation between the two treatment layers is evenly sharable with the two ID blocks 2, 4. This achieves simple substrate transportation.

Fourth Embodiment

A fourth embodiment of the present invention will now be described with reference to the drawings. Here, the description common to that of the first to third embodiments is to be omitted.

In the first embodiment, the second ID block 4 is connected to the treating block 3, and the platform 47 (openers 45, 46) is provided on the second ID block 4. In this regard, the second ID block 4 in this embodiment is further configured in such a manner so as to load and unload the substrate W also with respect to the exposure device EXP.

Figure 13:
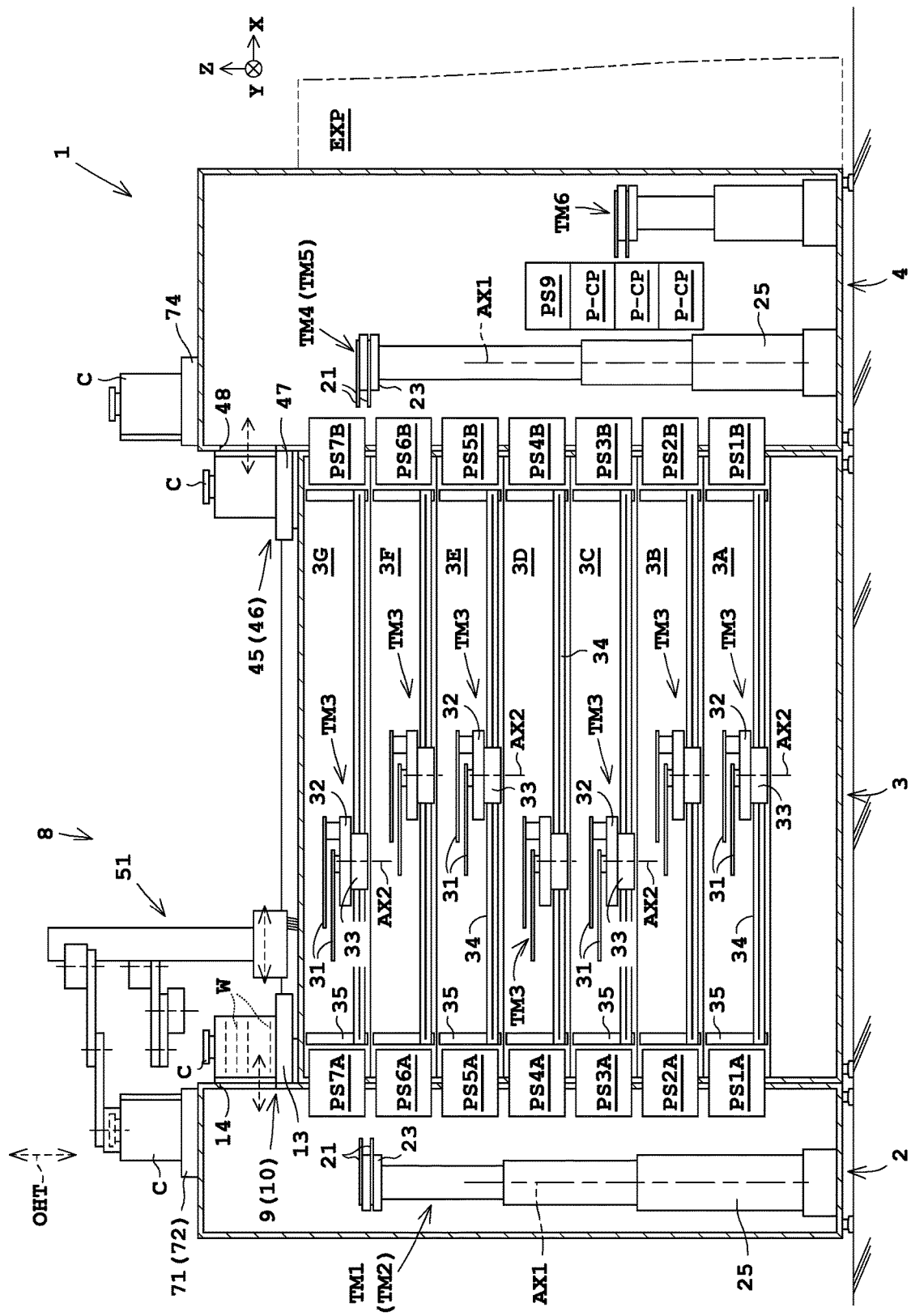
FIG. 13 is a longitudinal cross-sectional view of a substrate treating apparatus according to a fourth embodiment.
Figure 14:
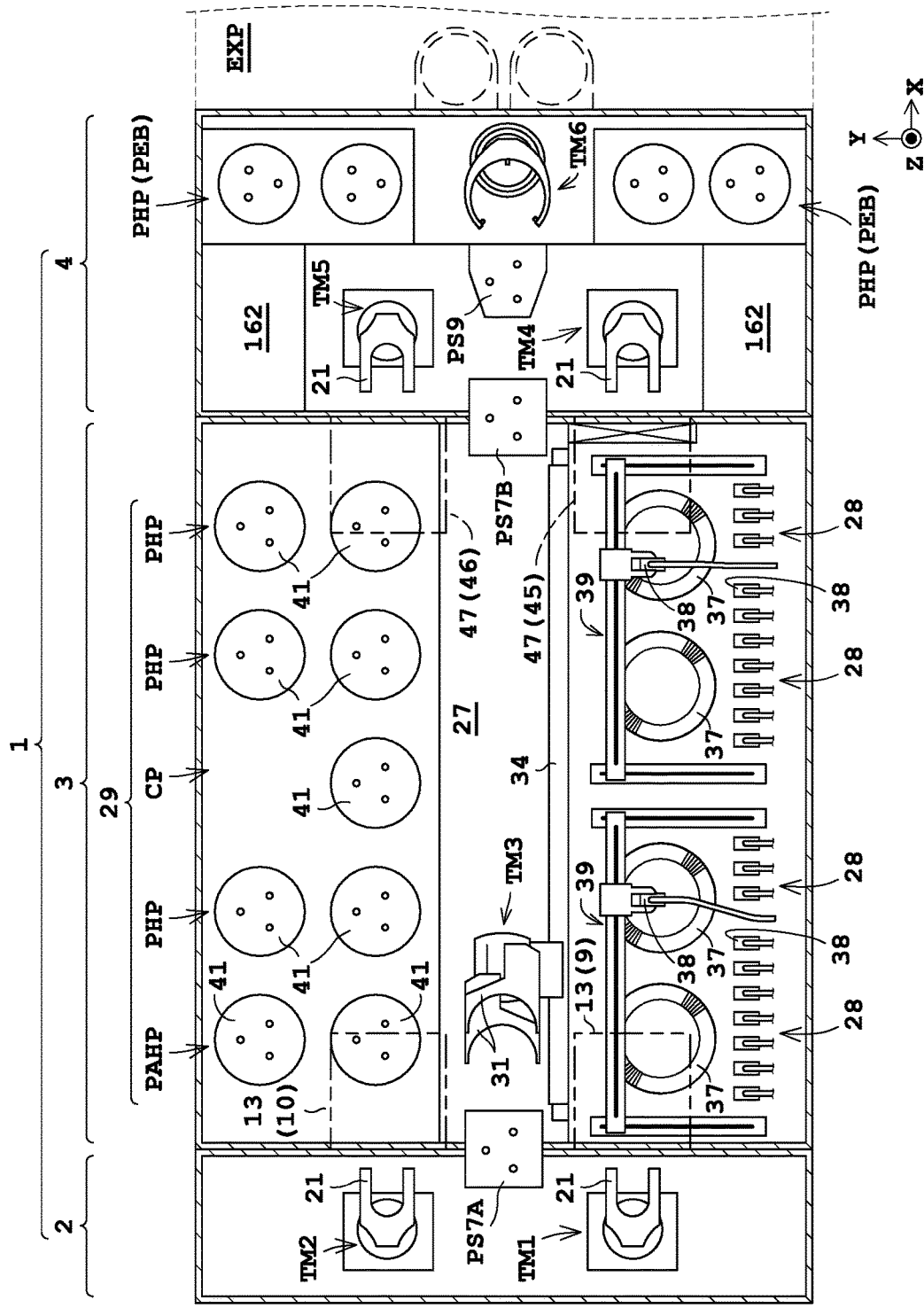
FIG. 14 is a horizontal cross-sectional view of the substrate treating apparatus according to the fourth embodiment.
Figure 15:
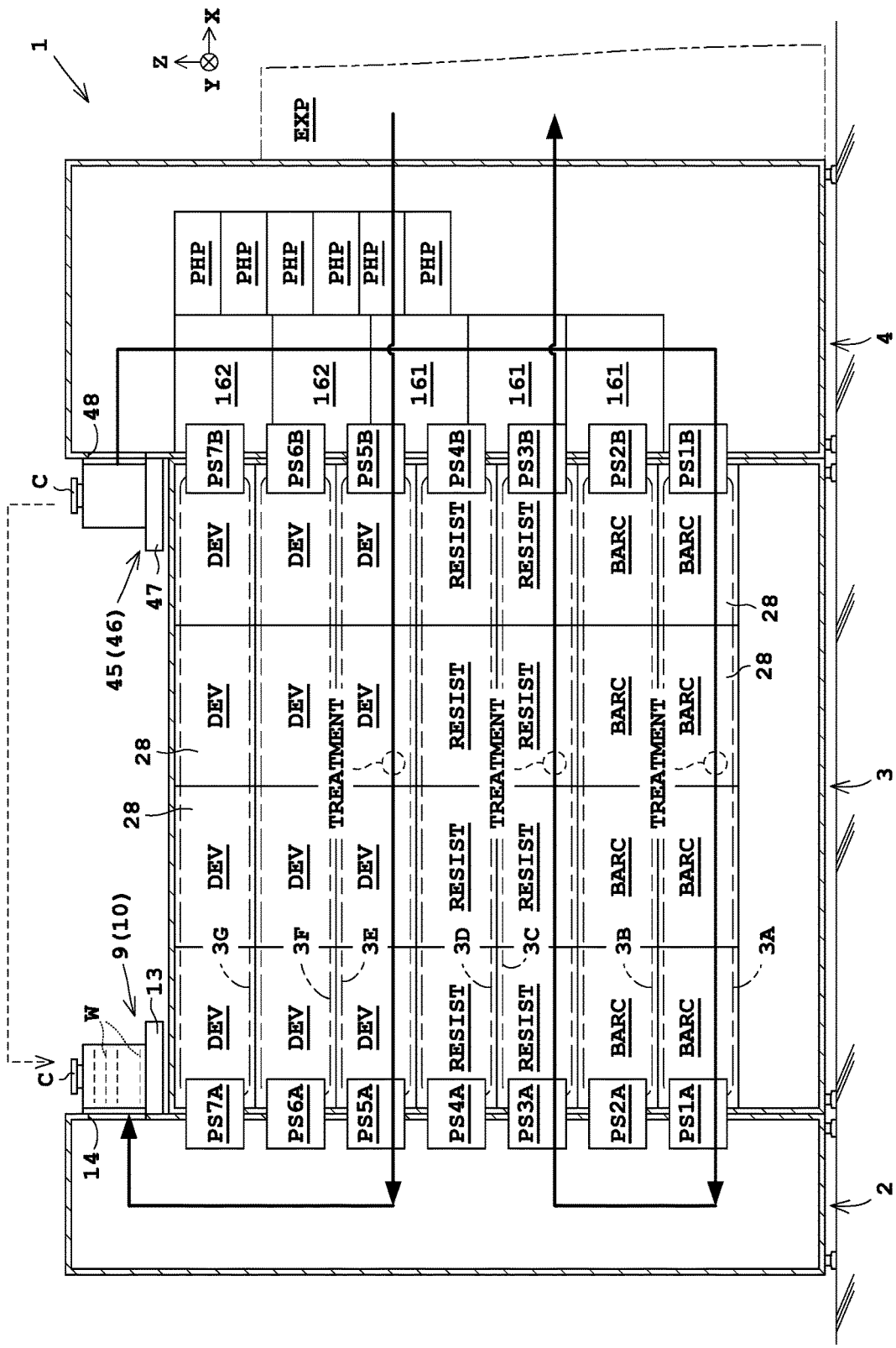
FIG. 15 is a right side view of the substrate treating apparatus according to the fourth embodiment and illustrates operation of the substrate treating apparatus.
Figure 16:
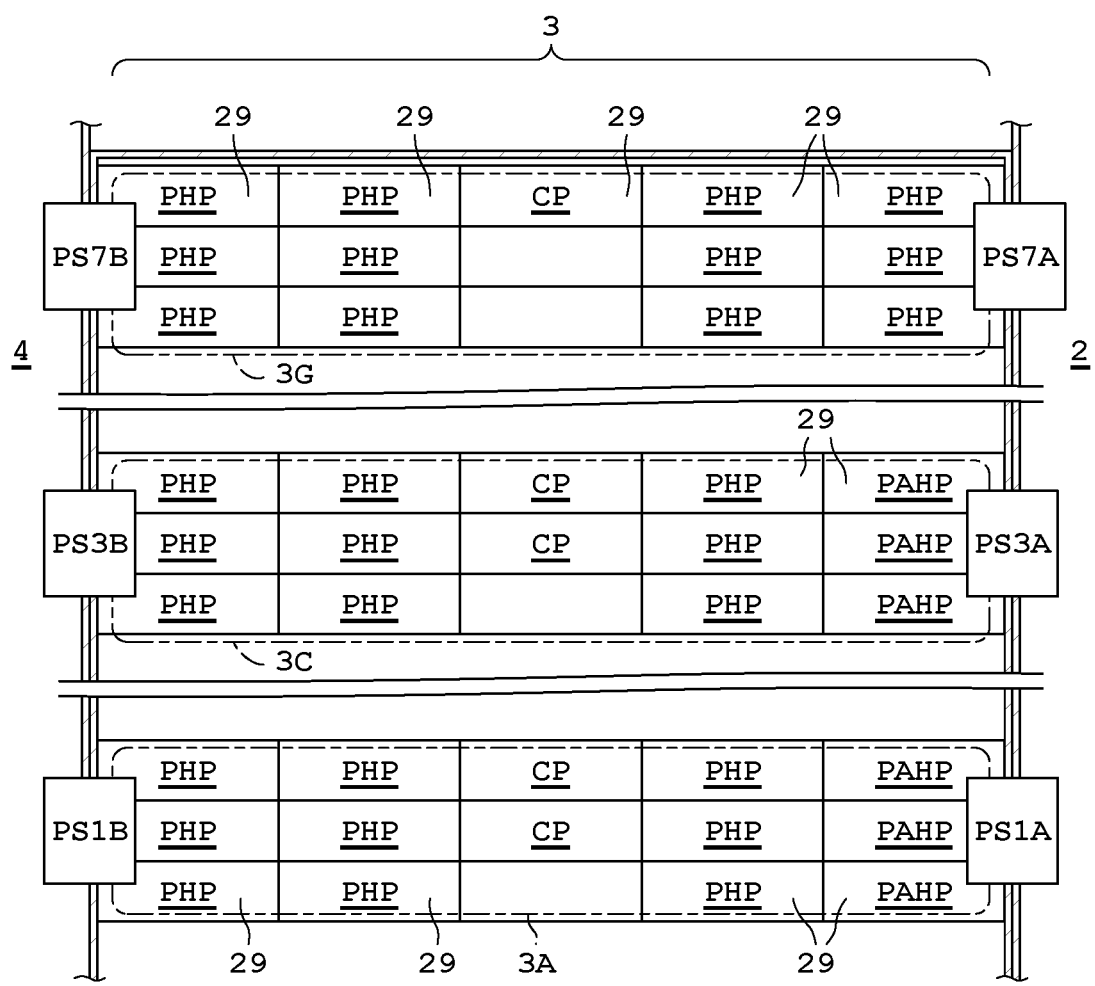
FIG. 16 is a partial left side view of the substrate treating apparatus according to the fourth embodiment.

FIG. 13 is a longitudinal cross-sectional view of a substrate treating apparatus 1 according to a fourth embodiment. FIG. 14 is a horizontal cross-sectional view of the substrate treating apparatus 1. FIG. 15 is a right side view of the substrate treating apparatus 1. FIG. 16 is a partial left side view of the substrate treating apparatus 1.

As illustrated in FIG. 13, the second ID block 4 is configured in such a manner so as to load and unload the substrate W with respect to the exposure device EXP. The second ID block 4 also functions as an interface block. The second ID block 4 includes three substrate transport mechanisms TM4 to TM6, a plurality of pre-exposure cleaning units 161, a plurality of post-exposure cleaning units 162, heating/cooling units PHP (PEB), three mounting-cum-cooling units P-CP, and a platform PS9.

The fourth substrate transport mechanism TM4 and a fifth substrate transport mechanism TM5 are disposed in a Y-direction perpendicular with respect to the forward/rearward direction (X-direction). The sixth substrate transport mechanism TM6 is disposed rearward of the two substrate transport mechanisms TM4, TM5 (right side of FIG. 14). The pre-exposure cleaning unit 161 faces the post-exposure cleaning unit 162 across the two substrate transport mechanisms TM4, TM5. The three cleaning units 161 and the two cleaning units 162 are disposed on both sides adjacent to the fourth substrate transport mechanism TM4 and the fifth substrate transport mechanism TM5 (see FIGS. 14, 15).

The pre-exposure cleaning unit 161 cleans and dries the substrate W prior to an exposure treatment. The post-exposure cleaning unit 162 cleans and dries the substrate W subsequent to the exposure treatment. Each of the cleaning units 161, 162 includes a holding rotation portion configured to hold the substrate W, and nozzles through which a liquid such as a cleaning liquid or a rinse liquid is dispensed to the substrate W. Moreover, each of the cleaning units 161, 162 may perform polishing to a rear face and an edge (bevel portion) of the substrate W with use of a brush and the like. Here, the rear face of the substrate W is a face opposite to the face where circuit patterns are formed, for example.

As illustrated in FIG. 14, the heating/cooling units PHP in the second ID block 4 are provided to face each other across the sixth substrate transport mechanism TM6. Six heating/cooling units PHP are arranged adjacent to the fourth substrate transport mechanism TM4 (see FIGS. 14, 15) in the upward/downward direction. Moreover, six heating/cooling units PHP are also arranged adjacent to the fifth substrate transport mechanism TM5 (see FIG. 14) in the upward/downward direction.

Three mounting-cum-cooling units P-CP and a platform PS9 are surrounded by the three substrate transport mechanisms TM4 to TM6 (see FIGS. 13, 14). The three mounting-cum-cooling units P-CP and the substrate platform PS9 are arranged in the upward/downward direction.

The fourth substrate transport mechanism TM4 is capable of transporting a substrate W among the eight substrate platforms PS1B to PS7B, PS9, the three mounting-cum-cooling units P-CP, the cleaning units 161, 162, the heating/cooling units PHP and the carrier C placed on the opener 45.

The fifth substrate transport mechanism TM5 is capable of transporting a substrate W among the eight substrate platforms PS1B to PS7B, PS9, the three mounting-cum-cooling units P-CP, the cleaning units 161, 162, the heating/cooling units PHP and the carrier C placed on the opener 46.

The sixth substrate transport mechanism TM6 is capable of transporting a substrate W among the substrate platform PS9, the three mounting-cum-cooling units P-CP, and the exterior exposure device EXP. Each of the three substrate transport mechanisms TM4 to TM6 is configured in substantially the same manner as that of the first substrate transport mechanism TM1, for example, and thus the description thereof is to be omitted.

Seven substrate platforms PS1A to PS7A are disposed between the first ID block 2 and the seven treatment layers 3A to 3G Moreover, seven substrate platforms PS1B to PS7B are disposed between the seven treatment layers 3A to 3G and the second ID block 4.

[Configuration of Treating Block 3]

Reference is made to FIG. 15. The treating block 3 includes seven treatment layers 3A to 3G The seven treatment layers 3A to 3G are arranged to be laminated in the upward/downward direction (Z-direction). Two lower treatment layers 3A, 3B each include coating units BARC configured to form an antireflection film on a substrate W.

Two middle treatment layers 3C, 3D each include coating units RESIST configured to form a resist film on a substrate W.

Moreover, three upper treatment layers 3E to 3G (i.e., 3E, 3F, 3G) each include four developing units DEV as the liquid-treating unit 28. The developing unit DEV develops the exposed substrate W. The four developing units DEV are arranged in four lines×one levels. The nozzles 38 illustrated in FIG. 14 eject a developer.

Moreover, similarly to a treatment layer 3G in FIG. 16, the heat-treatment units 29 of the three treatment layers 3E to 3G are configured to be arrangeable in five lines×three levels. Each of the three treatment layers 3E to 3G includes one cooling unit CP, and twelve heating/cooling units PHP. It should be noted that the numbers and types of the liquid-treating units 28, the heat-treatment units 29, and other units are variable where appropriate. Moreover, FIG. 16 illustrates arrangement of the heat treating units 29 on the three treatment layers 3A, 3C, 3G representative of the seven treatment layers 3A to 3G The heat-treatment units 29 are arranged in each of the two treatment layers 3B, 3D in the same manner as that in the treatment layers 3A, 3C. Moreover, the heat-treatment units 29 are arranged in each of the two treatment layers 3E, 3F in the same manner as that in the treatment layer 3G <Operation of Substrate Treating Apparatus 1>

An operation of the substrate treating apparatus 1 according to this embodiment will now be described. Reference is made to FIG. 15.

[Step S31] Second ID Block 4

The second ID block 4 takes a substrate W from the carrier C placed on the carrier platform 47 of one of the two openers 45, 46, and transports the taken substrate W to one of the two treatment layers 3A, 3B. Detailed description is as under. For instance, the fourth substrate transport mechanism TM4 of the second ID block 4 takes a substrate W from the carrier C placed on the platform 47 of the opener 45, and transports the taken substrate W to the substrate platform PS1B.

[Step S32] Treatment Layers 3A, 3B in Treating Block 3 (First Coating Treatment)

The treatment layers 3A, 3B each perform the first coating treatment (e.g., antireflection film formation) on the transported substrate W, and transports the substrate W subjected to the first coating treatment to the first ID block 2. For instance, in the treatment layer 3A of the treating block 3, the third substrate transport mechanism TM3 in FIGS. 13, 14 receives a substrate W from the substrate platform PS1B, and transports the received substrate W to at least the coating unit BARC. Thereafter, the third substrate transport mechanism TM3 transports the substrate W on which the antireflection film is formed in the coating unit BARC to the substrate platform PS1A.

[Step S33] First ID Block 2

The first ID block 2 transports the transported substrate W, subjected to the first coating treatment, to the treatment layer 3C. That is, one of the two substrate transport mechanisms TM1, TM2 transports the substrate W from the substrate platform PS1A to the substrate platform PS3A in FIG. 15. Here, the substrate W subjected to the first coating treatment in the treatment layer 3B is sent to the treatment layer 3D (i.e., from the substrate platform PS2A to the substrate platform PS4A).

[Step S34] Treatment Layers 3C, 3D in Treating Block 3 (Second Coating Treatment)

The treatment layers 3C, 3D each perform the second coating treatment (e.g., resist film formation) on the transported substrate W, and transports the substrate W subjected to the second coating treatment to the second ID block 4. For instance, in the treatment layer 3C of the treating block 3, the third substrate transport mechanism TM3 in FIGS. 13, 14 receives a substrate W from the substrate platform PS3A. The third substrate transport mechanism TM3 transports the received substrate W to at least a coating unit RESIST. The third substrate transport mechanism TM3 transports the substrate W on which a resist film is formed by the coating unit RESIST to the substrate platform PS3B.

[Step S35] Second ID Block 4 (Exposure Treatment by Exposure Device)

The second ID block 4 unloads the substrate W treated in one of the two treatment layers 3C, 3D into the exposure device EXP. Moreover, the second ID block 4 loads the substrate W, subjected to the exposure treatment by the exposure device EXP, from the exposure device EXP. The second ID block 4 transports the loaded substrate W to the three treatment layers 3E to 3G Detailed description is as under.

One of the two substrate transport mechanisms TM4, TM5 in the second ID block 4 receives the substrate W from the substrate platform PS3B, and transports the received substrate W to the pre-exposure cleaning unit 161 and the mounting-cum-cooling unit P-CP in this order. The sixth substrate transport mechanism TM6 transports the substrate W from the mounting-cum-cooling unit P-CP to the exposure device EXP. The exposure device EXP performs the exposure treatment on the transported substrate W.

The sixth substrate transport mechanism TM6 transports the substrate W exposed by the exposure device EXP from the exposure device EXP to the substrate platform PS9. One of the two substrate transport mechanisms TM4, TM5 receives the substrate W from the substrate platform PS9, and transports the received substrate W to the post-exposure cleaning unit 162, the heating/cooling unit PHP of the second ID block 4, and the substrate platform PS5B, for example, in this order. Here, the heating/cooling unit PHP performs post-exposure baking (PEB).

[Step S36] Treatment Layers 3E to 3G in Treating Block 3 (Developing Treatment)

Any of the three treatment layers 3E to 3G in the treating block 3 performs the developing treatment on the transported substrate W, and transports the substrate W subjected to the developing treatment to the first ID block 2. For instance, in the treatment layer 3E, the third substrate transport mechanism TM3 receives the substrate W from the substrate platform PS5B, and transports the received substrate W to the cooling unit CP, the developing unit DEV, the heating/cooling unit PHP, and the substrate platform PS5A in this order. It should be noted that, in the three treatment layers 3E to 3G a treatment by the heating/cooling unit PHP after the treatment by the developing unit DEV is omittable.

[Step S37] First ID Block 2

The first ID block 2 returns the substrate W, developed in any of the treatment layers 3E to 3G to a carrier C placed on the platform 13 of any of the two openers 9, 10. Detailed description is as under. For instance, the first substrate transport mechanism TM1 receives the substrate W from the substrate platform PS5A, and returns the received substrate W to the carrier C placed on the platform 13 of the opener 9.

According to this embodiment, treatment layers 3A to 3G each send the substrate W from the ID block as a start of sending the substrate W to the opposite ID block (e.g., from the first ID block 2 to the second ID block 4). The substrate platform PS1A to PS7A used for substrate transportation is disposed between the treatment layers 3A to 3G and the first ID block 2. Moreover, the substrate platforms PS1B to PS7B are disposed between the treatment layers 3A to 3G and the second ID block 4. When the substrate W is returned to the ID block as the start of sending the substrate W (such as when the substrate W sent from the first ID block 2 is returned to the first ID block 2), two types of substrate platforms, i.e., a substrate platform for sending and a substrate platform for return, have to be disposed adjacent to one of the ID blocks. Accordingly, the numbers of substrates W placeable on the substrate platform for sending and the substrate platform for return become limitative. However, the substrate is sent from the ID block as the start of sending the substrate W to the ID block opposite thereto, ensuring the number of substrates W placeable on the substrate platforms. In addition, since the two ID blocks 2, 4 perform alternate transportation, the two ID blocks 2, 4 are capable of separating substrate transportation between the layers substantially evenly.

Figure 17A:
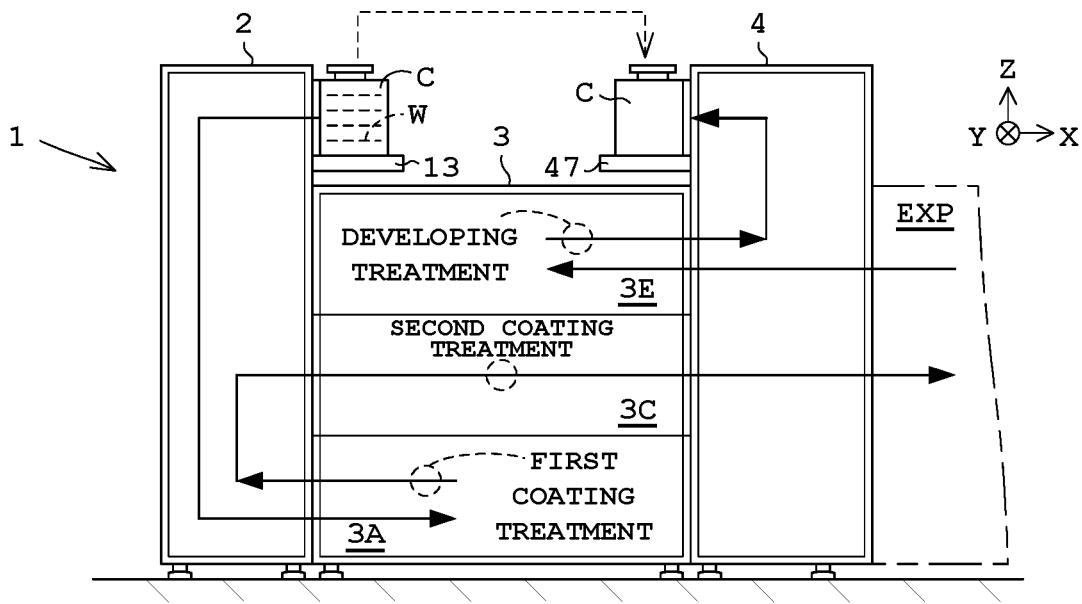
FIGS. 17A and 17B each illustrate operation of a substrate treating apparatus according to one modification of the fourth embodiment.
Figure 17B:
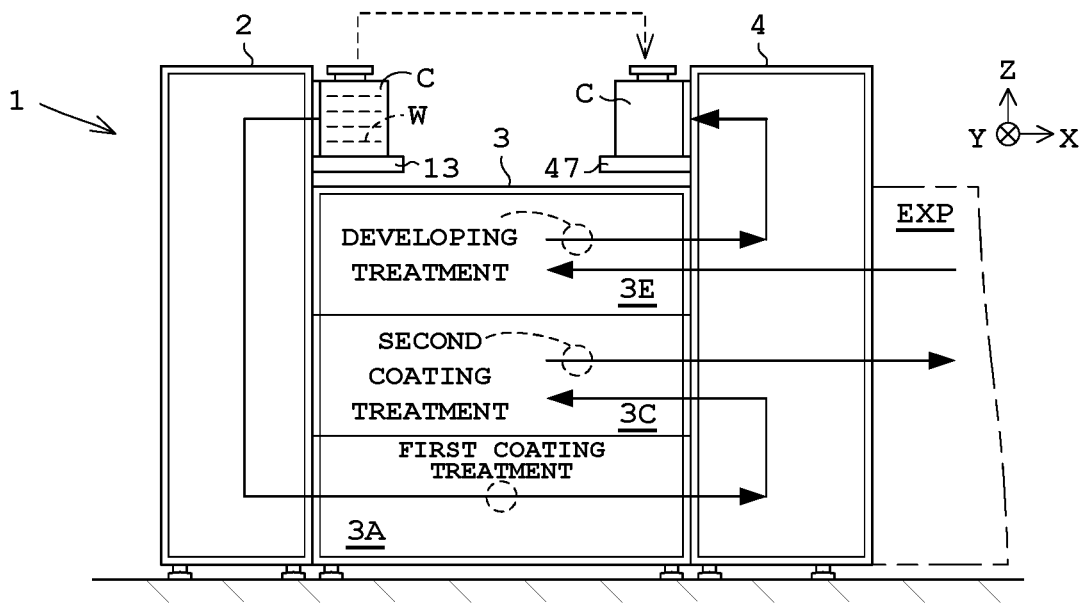

The following describes other operational example with reference to FIGS. 17A, 17B. Here in FIGS. 17A, 17B, the treating block 3 includes three treatment layers 3A, 3C, 3E. Moreover, as described above, an antireflection film is formed on the substrate W in the treatment layer 3A, and a resist film is formed on the substrate W in the treatment layer 3C, for example. Moreover, a developing treatment is performed on the substrate W in the treatment layer 3E, for example.

<Additional Operational Example 1>

Reference is made to FIG. 17A. The first ID block 2 takes a substrate W from the carrier C on the platform 13, and transports the taken substrate W to the treatment layer 3A. The substrate W transported into the treatment layer 3A and treated in the treatment layer 3A is transported to the first ID block 2, the treatment layer 3C (second coating treatment), the second ID block 4, the exposure device EXP, the second ID block 4, the treatment layer 3E (developing treatment), and the second ID block 4 in this order. Then, the second ID block 4 accommodates the substrate W, treated in the treatment layer 3E, into the carrier C on the platform 47.

<Additional Operational Example 2>

Reference is made to FIG. 17B. The first ID block 2 takes a substrate W from the carrier C on the platform 13, and transports the taken substrate W to the treatment layer 3A. The substrate W transported into the treatment layer 3A and treated in the treatment layer 3A is transported to the second ID block 4, the treatment layer 3C (second coating treatment), the second ID block 4, the exposure device EXP, the second ID block 4, the treatment layer 3E (developing treatment), and the second ID block 4 in this order. Then, the second ID block 4 accommodates the substrate W, treated in the treatment layer 3E, into the carrier C on the platform 47.

According to the additional operational examples 1 and 2, in the configuration where the treatment layers 3A, 3C, 3E and the exposure device EXP perform different treatments on the substrate W in order, for example, substrate transportation for loading and unloading the substrate W with respect to the carrier C and substrate transportation between the treatment layers can be shared with the two ID blocks 2, 4.

Fifth Embodiment

A fifth embodiment of the present invention will now be described with reference to the drawings. Here, the description common to that of the first to fourth embodiments is to be omitted.

In the fourth embodiment, the treating block 3 includes the two treatment layers 3A, 3B for forming the antireflection film, the two treatment layers 3C, 3D for forming the resist film, and the three treatment layers 3E to 3G for performing the developing treatment. That is, the treating block 3 in the fourth embodiment includes three types of treatment layers. In this regard, the present embodiment may include two types of treatment layers.

Figure 18:
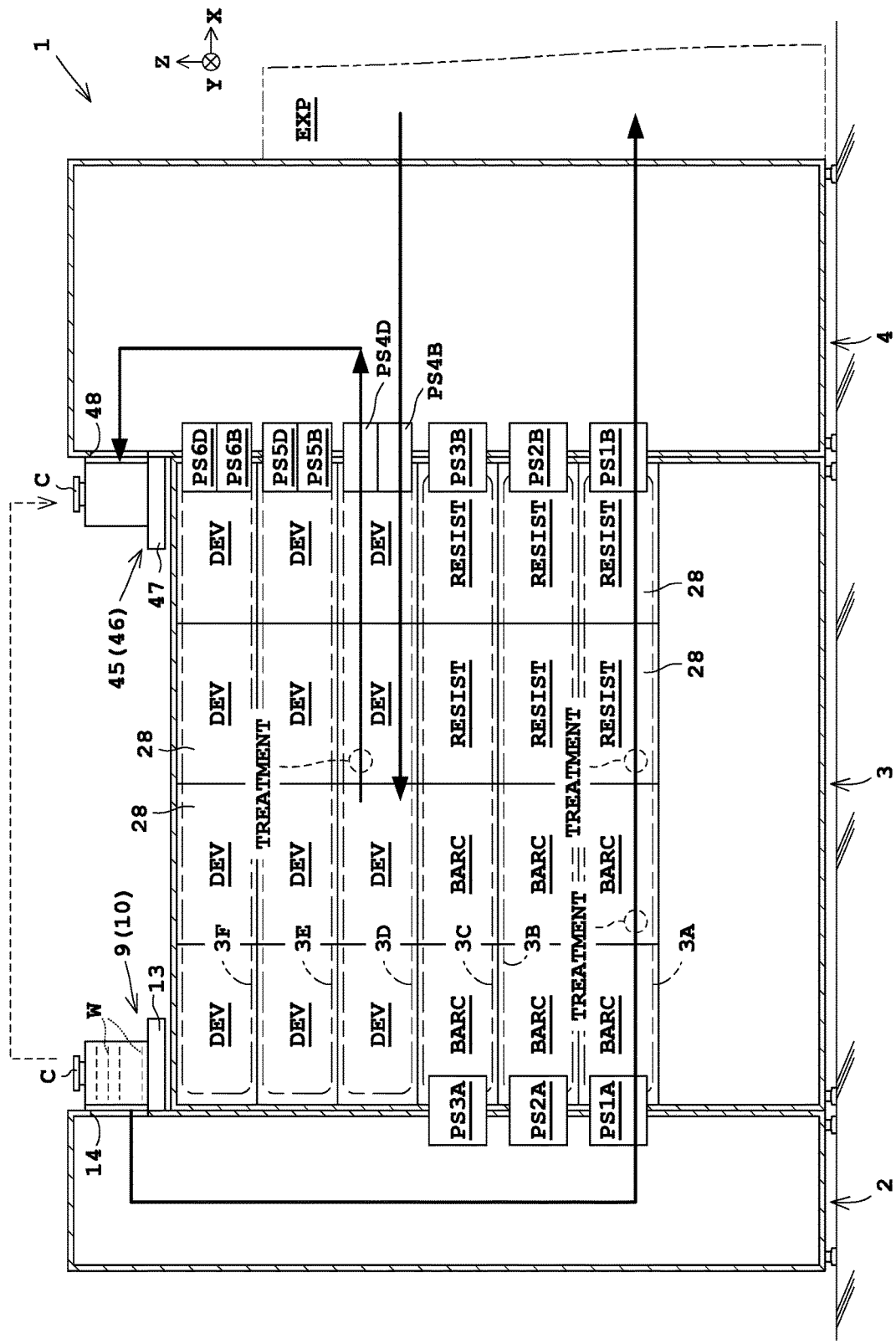
FIG. 18 is a right side view of a substrate treating apparatus according to a fifth embodiment and illustrates operation of the substrate treating apparatus.

FIG. 18 is a right side view illustrating arrangement of the liquid-treating unit 28 of the treating block 3 according to the fifth embodiment. The treating block 3 includes six treatment layers 3A to 3F. In each of three lower treatment layers 3A to 3C, an antireflection film is formed, and thereafter a resist film is formed. Moreover, a developing treatment is performed in three upper treatment layers 3D to 3F.

An operation of the substrate treating apparatus 1 according to this embodiment will now be described. Reference is made to FIG. 18. The first ID block 2 takes a substrate W from the carrier C on the platform 13, and transports the taken substrate W to the treatment layer 3A, for example. The substrate W transported into the treatment layer 3A and treated in the treatment layer 3A is transported to the second ID block 4, the exposure device EXP, the second ID block 4, the treatment layer 3D, and the second ID block 4, in this order. Then, the second ID block 4 accommodates the substrate W, treated in the treatment layer 3D, into the carrier C on the platform 47. Here, the substrate W treated in the treatment layer 3B is subjected to the developing treatment in the treatment layer 3E after the exposure treatment, for example. Moreover, the substrate W treated in the treatment layer 3C is subjected to the developing treatment in the treatment layer 3F after the exposure treatment, for example.

<Other Operational Examples>

Figure 19:
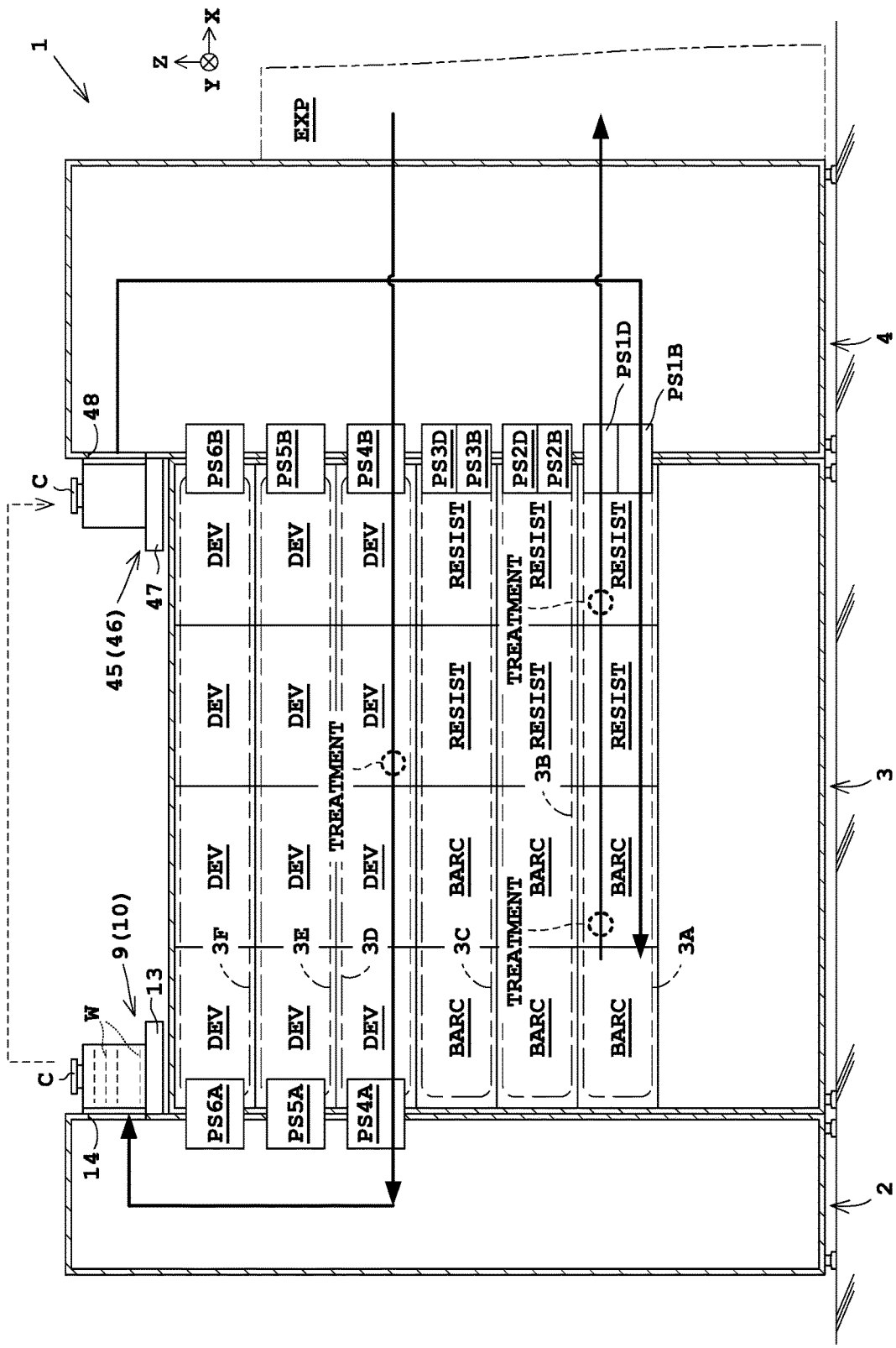
FIG. 19 illustrates operation of the substrate treating apparatus according to the fifth embodiment.

Reference is made to FIG. 19. The second ID block 4 takes a substrate W from the carrier C on the platform 47, and transports the taken substrate W to the treatment layer 3A. The substrate W transported into the treatment layer 3A and treated in the treatment layer 3A is transported to the second ID block 4, the exposure device EXP, the second ID block 4, the treatment layer 3D, and the first ID block 2, in this order. Then, the first ID block 2 accommodates the substrate W, treated in the treatment layer 3E, into the carrier C on the platform 13.

According to this embodiment, in the configuration where the treatment layers 3A, 3D and the exposure device EXP perform different treatments on the substrate W in order, for example, substrate transportation for loading and unloading the substrate W with respect to the carrier C and substrate transportation between the treatment layers can be shared with the two ID blocks 2, 4.

This invention is not limited to the foregoing examples, but may be modified as follows.

(1) In the first embodiment described above, the six treatment layers 3A to 3F each include the four liquid-treating units 28, and the four liquid-treating units 28 are formed by the two coating units BARC and the two coating units RESIST as in FIG. 3. In this regard, the four liquid-treating units 28 may all be formed by the coating units BARC, for example. Moreover, the four liquid-treating units 28 may all be formed by the coating units RESIST. The four liquid-treating units 28 may all be formed by coating units configured to form a resist cover film.

(2) In the first embodiment described above, the treatment layers 3A to 3F in the treating block 3 each perform the coating treatment on a substrate W as in FIG. 3. Alternatively, the treatment layers 3A to 3F may perform the developing treatment on the substrate W. Moreover, the treatment layers 3A to 3F may perform the cleaning treatment on the substrate W. When the cleaning treatment is performed on a rear face of the substrate W, the substrate W may be inversed by any of the inversion units R1 to R4 disposed in the two ID blocks 2, 4, illustrated by dotted lines in FIG. 2. For instance, when a front face of the substrate W is directed upwardly, the substrate W is inversed to be directed downwardly. Moreover, the inversion unit may be disposed in at least one of the substrate platforms PS6A to PS6F between the ID block 2 and the treatment layers 3A to 3F.

Moreover, the following is usable as the treating liquid for cleaning an ammonia hydrogen peroxide mixed solution (APM), deionized water (DIW), carbonated water, hydrogenated water, ammonia water (NH$_4$OH), SC1, SC2, a citric acid solution, a mixed chemical of hydrofluoric acid and ozone (FOM), a mixed chemical of hydrofluoric acid, hydrogen peroxide solution and deionized water (FPM), hydrofluoric acid (HF), HCl, isopropyl alcohol (IPA), tetramethylammonium hydroxide (TMAH), trimethyl-2-hydroxyethyl ammonium hydroxide solution (CHOLINE).

(3) In the second embodiment described above, in the treating block 3, three lower treatment layers 3A to 3C each perform a first coating treatment to form an antireflection film, and three upper treatment layers 3D to 3F each perform a second coating treatment to form a resist film, as illustrated in FIG. 9. The three lower treatment layers 3A to 3C may perform a rear-face cleaning treatment (first cleaning treatment), and the three upper treatment layers 3D to 3F may perform a front-face cleaning treatment (second cleaning treatment).

A cleaning unit 81 configured to perform a front-face cleaning treatment includes a holding rotation portion 82, a liquid supplying unit 83, and a spray cleaning mechanism 120, as illustrated in FIG. 20A. The holding rotation portion 82 includes a spin chuck 86A configured to hold a lower face of the substrate W by, for example, vacuum adsorption, and a drive unit 88 configured to rotate the spin chuck 86A around a rotation axis AX4. The liquid supplying unit 83 includes a nozzle 90 configured to dispense a treating liquid, and a supplying pipe 92 in communication with the nozzle 90. The spray cleaning mechanism 120 includes a spray nozzle (binary nozzle) 121, and a liquid supplying pipe 123 in communication with the spray nozzle 121.

The treating liquid as well as nitrogen gas (inert gas) are supplied to the spray nozzle 121 via the liquid supplying pipe 123. The holding rotation portion 82 rotates the held substrates W. The nozzle 90 dispenses the treating liquid to the upper face of the rotating substrate W. The spray nozzle 121 sprays a mist of a treating liquid to the upper face of the rotating substrate W. This achieves cleaning of an upper face, i.e., the front face of the substrate W. Here, the cleaning unit 81 in FIG. 20A may include a spin chuck 86B in FIG. 20B instead of the spin chuck 86A.

Moreover, a cleaning unit 81 configured to perform a rear-face cleaning treatment includes, for example, a holding rotation portion 82, a liquid supplying unit 83, and a brush cleaning mechanism 84, as illustrated in FIG. 20B. The spin chuck 86B contacts an end of the substrate W with a plurality of retaining pins 85, thereby holding the substrate W. The brush cleaning mechanism 84 includes a brush cleaner 94, an arm 96 configured to support the brush cleaner 94 with a first end of the arm 96 in a rotatable manner, and a drive unit 98 configured to support a second end of the arm 96 to rotate the arm 96 around a vertical axis AX5. Moreover, the drive unit 98 is capable of moving the arm 96 vertically. The two drive units 88, 98 each include an electric motor. The supplying unit 81 illustrated in FIG. 20B contacts the brush cleaner 94 on the upper face of the substrate W while dispensing the treating liquid to the upper face of the rotating substrate W through the nozzle 90. This achieves cleaning of the face on an upper side, i.e., the rear face of the substrate W.

Moreover, in FIG. 9, the three lower treatment layers 3A to 3C may perform a bevel cleaning treatment (first cleaning treatment), and the three upper treatment layers 3D to 3F may perform the rear-face cleaning treatment (second cleaning treatment). Here, the bevel cleaning treatment means that an outer edge of the substrate W is cleaned while an outer edge cleaning nozzle supplies a treatment liquid to an upper outer edge of the substrate W.

(4) In the third embodiment described above, in the treating block 3, the two lower treatment layers 3A, 3B each perform the first coating treatment to form an antireflection film, the two middle treatment layers 3C, 3D each perform the second coating treatment to form a resist film, and the two upper treatment layers 3E, 3F each perform the third coating treatment to form a resist cover film, as illustrated in FIG. 11. Alternatively, the lower treatment layers 3A, 3B may perform the first cleaning treatment, the middle treatment layers 3C, 3D may perform the second cleaning treatment, and the upper treatment layers 3E, 3F may perform the third cleaning treatment.

(5) In the third embodiment described above, as illustrated in FIG. 11, the second ID block 4 transports the transported substrate W to the treatment layer 3C, for example (Process A). The treatment layer 3C performs a predetermined treatment on the transported substrate W, and transports the substrate W to the first ID block 2 (Process B). The first ID block 2 transports the transported substrate W to the treatment layer 3E (Process C). The treatment layer 3E performs a predetermined treatment on the transported substrate W, and transports the substrate W to the second ID block 4 (Process D). Then, the second ID block 4 returns the substrate W treated in the treatment layer 3E to the carrier C placed on the platform 47.

Figure 21:
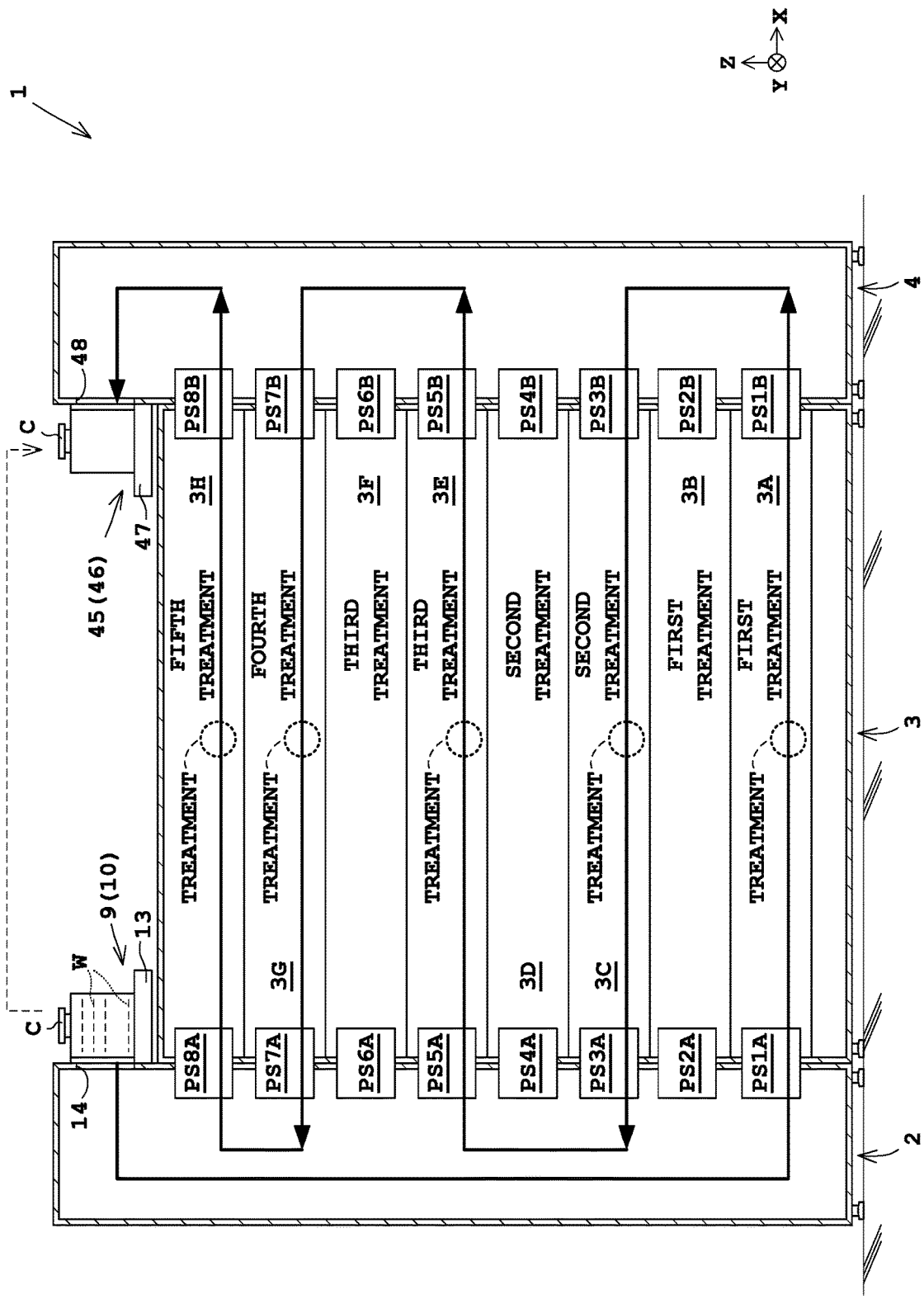
FIG. 21 illustrates a configuration and operation of a substrate treating apparatus according to one modification.

The substrate treating apparatus 1 (or its control unit 79) may operate as in FIG. 21 without causing the second ID block 4 to return the substrate W, treated in the treatment layer 3E, into the carrier C. Specifically, the substrate treating apparatus 1 further includes two treatment layers 3G, 3H that perform different treatments. As in the Process A to the Process D described above, the substrate W may reciprocate one time between the two ID blocks 2, 4 while the two treatment layers 3G, 3H perform the predetermined treatments. Moreover, the substrate treating apparatus 1 may further include two treatment layers, in addition to the two treatment layers 3G, 3H, that perform different treatments. In this case, the substrate W may reciprocate one more time between the two ID blocks 2, 4 while the two treatment layers perform the predetermined treatments. Then, the substrate treating apparatus 1 may operate in such a manner that the substrate W treated in the treatment layer in the last process is returned to the carrier C placed on the platform 47.

An operation of the substrate treating apparatus 1 in FIG. 21 will now be described. The first ID block 2 takes a substrate W from the carrier C on the platform 13, and transports the taken substrate W to one of the two treatment layers 3A, 3B (e.g., the treatment layer 3A). The treatment layer 3A performs a first treatment on the transported substrate W, and transports the substrate W to the second ID block 4. The second ID block 4 transports the transported substrate W to the treatment layer 3C. The treatment layer 3C performs a second treatment on the transported substrate W, and transports the substrate W to the first ID block 2. The first ID block 2 transports the transported substrate W to the treatment layer 3E. The treatment layer 3E performs a third treatment on the transported substrate W, and transports the substrate W to the second ID block 4.

Here, the second ID block 4 does not return the substrate W to the carrier C on the platform 47 but transports the substrate W to the treatment layer 3G The treatment layer 3G performs a fourth treatment on the transported substrate W, and transports the substrate W to the first ID block 2. The first ID block 2 transports the transported substrate W to the treatment layer 3H. The treatment layer 3H performs a fifth treatment on the transported substrate W, and transports the substrate W to the second ID block 4. Then, the second ID block 4 returns the substrate W, treated in the treatment layer 3H for the last process, into the carrier C on the platform 47.

The treating block 3 illustrated in FIG. 21 performs five types of treatments, i.e., the first to five treatments, in the five treatment layers 3A, 3C, 3E, 3F, 3H. Alternatively, seven types of treatments may be performed in seven treatment layers. Moreover, when the substrate W is transported into the treatment layer 3B in FIG. 21, the second ID block 4 transports the substrate W, subjected the first treatment in the treatment layer 3B, to the treatment layer 3D. Thereafter, the first ID block 2 transports the transported substrate W, subjected to the second treatment in the treatment layer 3D, to the treatment layer 3F. Thereafter, the substrate W subjected to the third treatment in the treatment layer 3F is transported to the treatment layers 3G and 3H in this order as described above.

(6) In the first to third embodiments described above, the first ID block 2 takes the substrate W from the carrier C placed on the platform 13, and the second ID block 4 returns the substrate W, treated in the treating block 3, into the carrier C placed on the platform 47. In this regard, the substrate W may be transported in an opposite direction. That is, the second ID block 4 may take the substrate W from the carrier C placed on the platform 47, and the first ID block 2 may return the substrate W, treated in the treating block 3, into the carrier C placed on the platform 13.

(7) In the fourth embodiment described above, the two treatment layers 3A, 3B perform the first coating treatment as illustrated in FIG. 15, for example. Alternatively, one treatment layer or three or more treatment layers may perform the first coating treatment. Moreover, the two treatment layers 3C, 3D perform the second coating treatment. Alternatively, one treatment layer or three or more treatment layers may perform the second coating treatment. Moreover, the three treatment layers 3E to 3G perform the developing treatment. Alternatively, one or two treatment layers or four or more treatment layers may perform the developing treatment.

(8) In the fourth embodiment described above, the treating block 3 includes the three treatment layers 3A, 3C, 3E that perform three types of treatments different from one another, for example. In this regard, the treating block 3 may include four treatment layers that perform four types of treatments different from one another, for example.

FIGS. 22A to 22C, 23A to 23C each illustrate a configuration and operation of a substrate treating apparatus according to one modification. It should be noted that common descriptions in FIGS. 22A to 23C and FIGS. 24A to 25B mentioned later are omitted where appropriate. In FIGS. 22A to 23C and FIGS. 24A to 25B mentioned later, the treating block 3 includes four treatment layers 3A to 3D that perform four types of treatments different from one another.

Here, the single treatment layer 3A performs the first treatment, for example. Alternatively, a plurality of treatment layers may perform the first treatment.

Figure 22A:
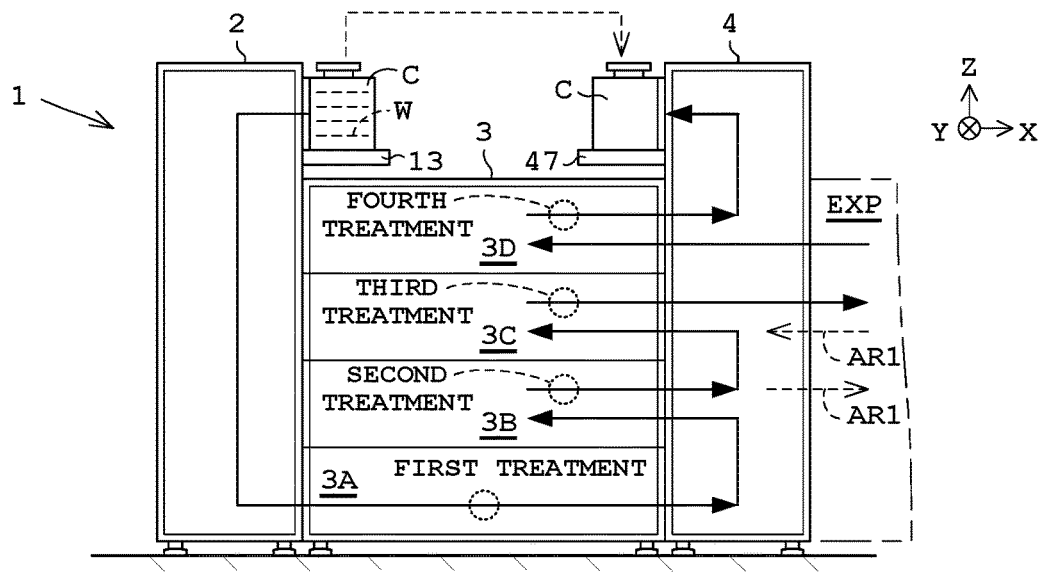
FIGS. 22A to 22C each illustrate a configuration and operation of a substrate treating apparatus according to one modification.

In the treating block 3 in FIG. 22A, the treatment layer 3A performs a first coating treatment, for example, whereas the treatment layer 3B performs a second coating treatment, for example. Moreover, a treatment layer 3C performs a third coating treatment, for example, whereas a treatment layer 4D performs a developing treatment, for example.

In FIG. 22A, the first ID block 2 takes a substrate W from the carrier C on the platform 13, and transports the taken substrate W to the treatment layer 3A. The treatment layer 3A performs the first coating treatment on the transported substrate W, and transports the substrate W to the second ID block 4. The second ID block 4 transports the transported substrate W to the treatment layer 3B. The treatment layer 3B performs the second coating treatment on the transported substrate W, and transports (returns) the substrate W to the second ID block 4. The second ID block 4 transports the transported substrate W to the treatment layer 3C. The treatment layer 3C performs the third coating treatment on the transported substrate W, and transports (returns) the substrate W to the second ID block 4.

Thereafter, the second ID block 4 unloads the substrate W treated in the treatment layer 3C into the exposure device EXP. The second ID block 4 loads the substrate W, subjected to the exposure treatment by the exposure device EXP, from the exposure device EXP, and transports the loaded substrate W to the treatment layer 3D. The treatment layer 3D performs the developing treatment on the transported substrate W, and transports the substrate W to the second ID block 4. The second ID block 4 returns the transported substrate W to the carrier C on the platform 47.

Here, the four treatment layers 3A to 3D in FIG. 22A may perform the following treatments, for example. The treatment layer 3A performs a first coating treatment, whereas the treatment layer 3B performs a second coating treatment. The treatment layer 3C performs post-exposure cleaning and post-exposure baking, whereas the treatment layer 3D performs a developing treatment. In such a case, as illustrated by the arrow AR1 by dotted lines in FIG. 22A, the exposure device EXP may perform the exposure treatment between the treatment layer 3B and the treatment layer 3C. Moreover, when the exposure treatment is performed at the position with the arrow AR1, the second ID block 4 transports the substrate W treated in the treatment layer 3C to the treatment layer 3D.

Figure 22B:
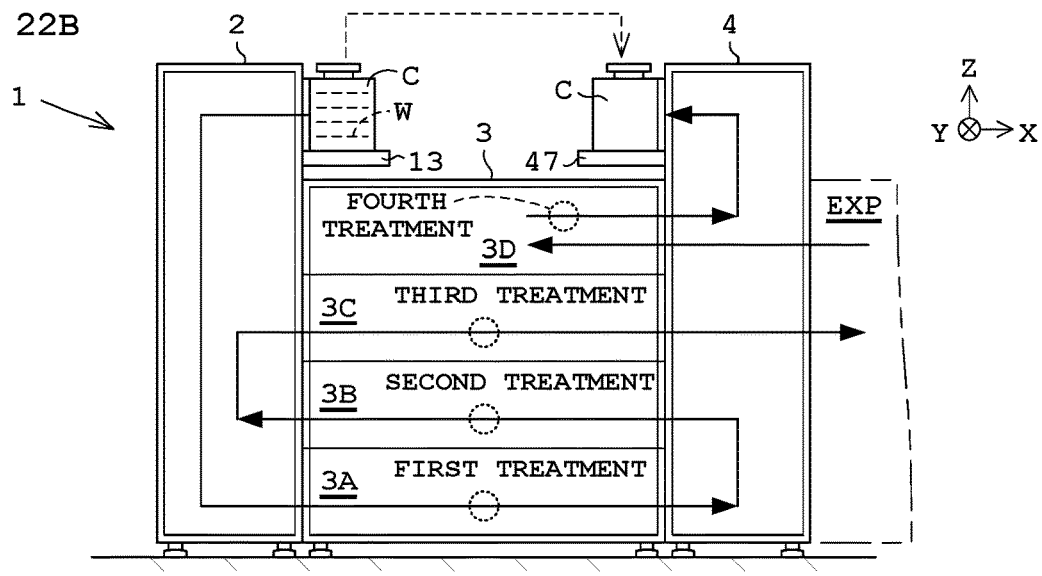

An operation of the substrate treating apparatus 1 in FIG. 22B will now be described. The first ID block 2 takes a substrate W from the carrier C on the platform 13. The taken substrate W is transported to the treatment layer 3A, the second ID block 4, the treatment layer 3B, the first ID block 2, the treatment layer 3C, the second ID block 4, the exposure device EXP, the second ID block 4, the treatment layer 3D, and the second ID block 4, in this order. Then, the second ID block 4 accommodates the substrate W, treated in the treatment layer 3D, into the carrier C on the platform 47. Here, the treatment layers 3A to 3D perform predetermined first to fourth treatments, respectively.

Figure 22C:
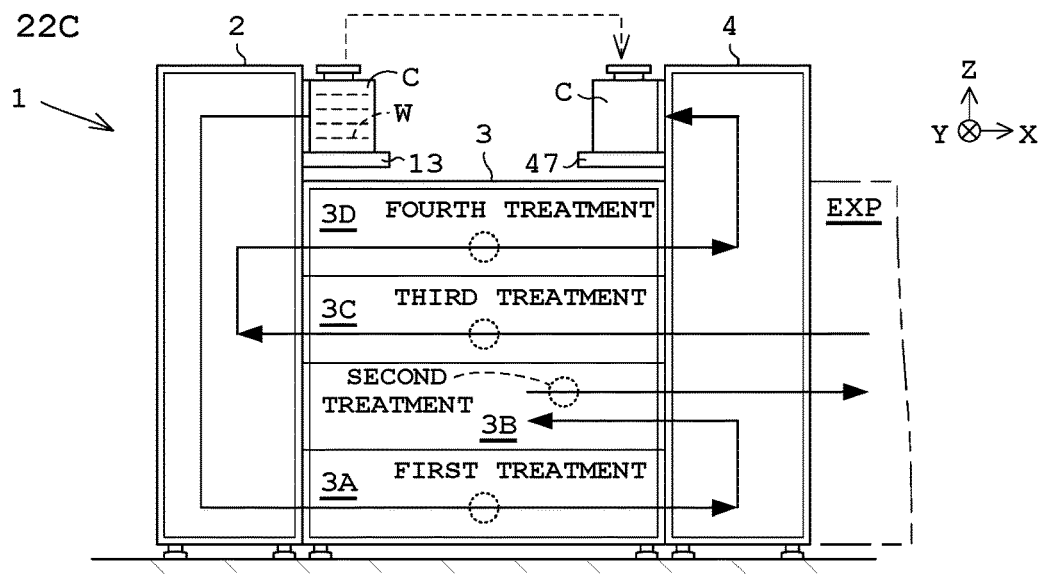

An operation of the substrate treating apparatus 1 in FIG. 22C will now be described. The first ID block 2 takes a substrate W from the carrier C on the platform 13. The taken substrate W is transported to the treatment layer 3A, the second ID block 4, the treatment layer 3B, the second ID block 4, the exposure device EXP, the second ID block 4, the treatment layer 3C, the first ID block 2, the treatment layer 3D, and the second ID block 4, in this order. Then, the second ID block 4 accommodates the substrate W, treated in the treatment layer 3D, into the carrier C on the platform 47. Here, the treatment layers 3A to 3D perform predetermined first to fourth treatments, respectively.

Figure 23A:
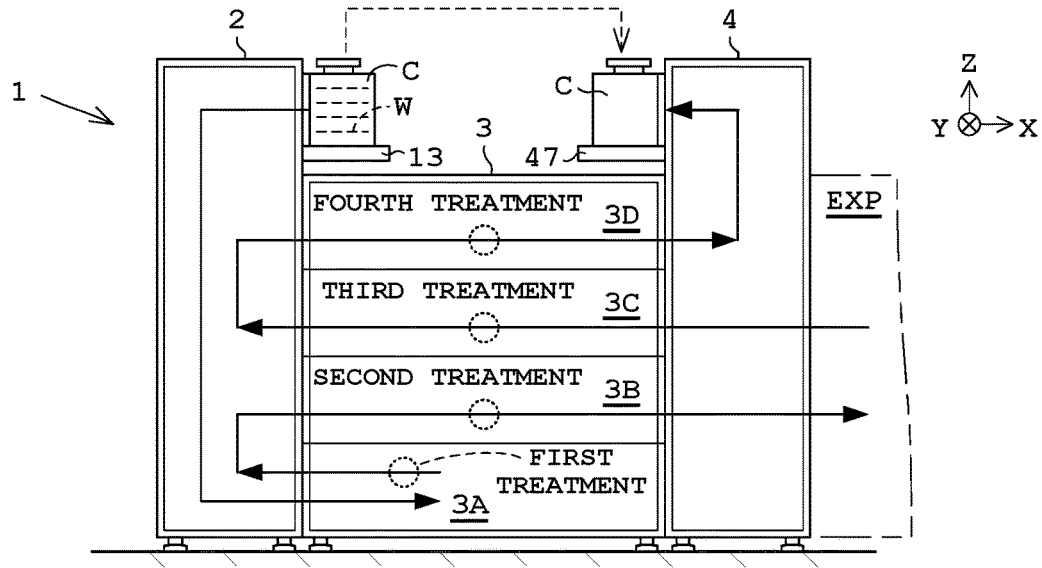
FIGS. 23A to 23C each illustrate a configuration and operation of a substrate treating apparatus according to one modification.

In FIG. 23A, the substrate W taken from the carriers C on the platform 13 of the first ID block 2 is transported to the treatment layer 3A, the first ID block 2, the treatment layer 3B, the second ID block 4, the exposure device EXP, the second ID block 4, the treatment layer 3C, the first ID block 2, the treatment layer 3D, and the second ID block 4, in this order.

Figure 23B:
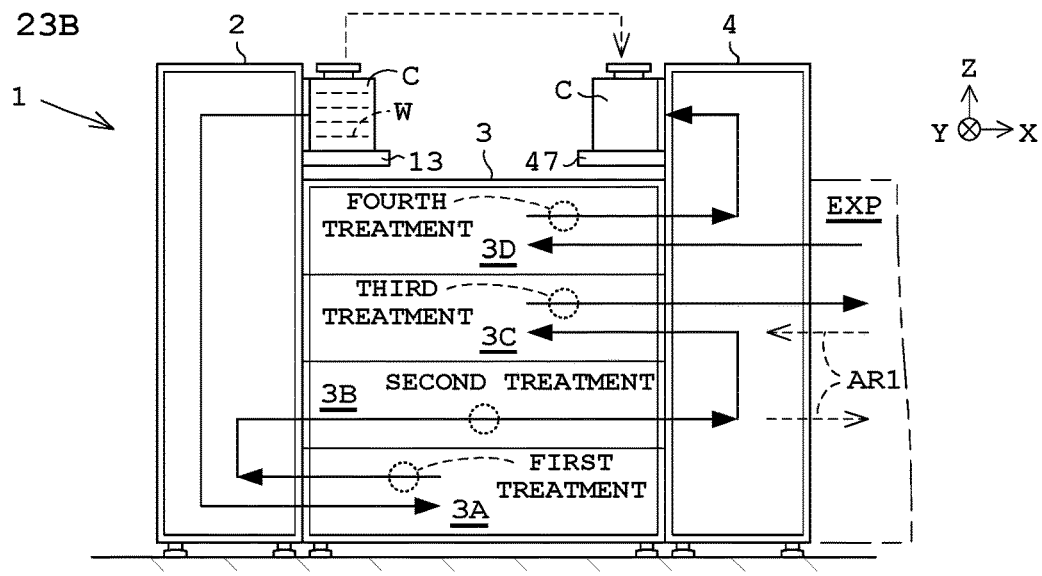

In FIG. 23B, the substrate W taken from the carriers C on the platform 13 of the first ID block 2 is transported to the treatment layer 3A, the first ID block 2, the treatment layer 3B, the second ID block 4, the treatment layer 3C, the second ID block 4, the exposure device EXP, the second ID block 4, the treatment layer 3D, and the second ID block 4, in this order. Moreover, as illustrated by the arrow AR1 in FIG. 23B, the exposure device EXP may perform the exposure treatment between the treatment layer 3B and the treatment layer 3C.

Figure 23C:
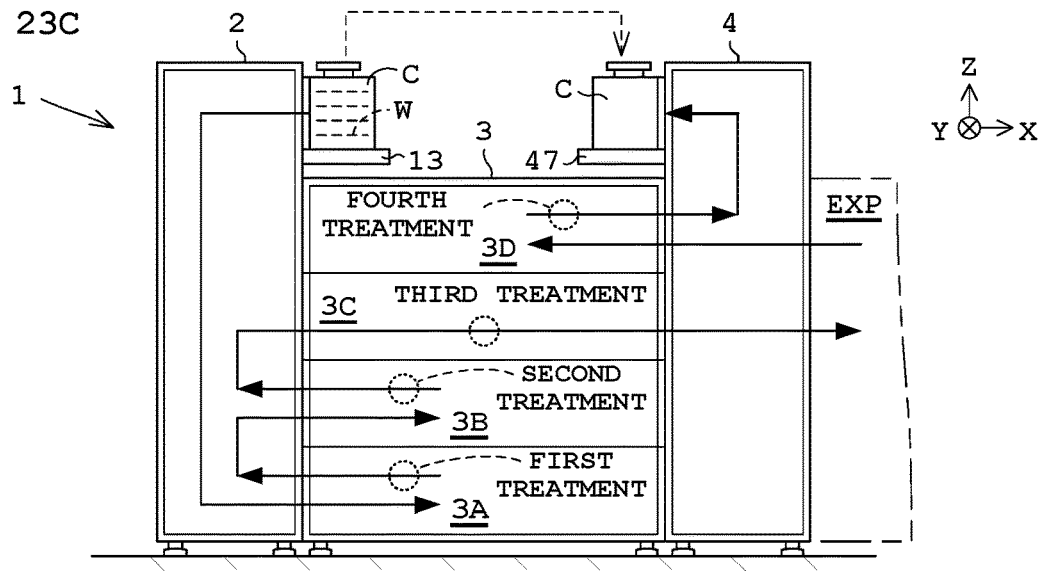

In FIG. 23C, the substrate W taken from the carriers C on the platform 13 of the first ID block 2 is transported to the treatment layer 3A, the first ID block 2, the treatment layer 3B, the first ID block 2, the treatment layer 3C, the second ID block 4, the exposure device EXP, the second ID block 4, the treatment layer 3D, and the second ID block 4, in this order.

An operation of the substrate treating apparatus 1 in FIGS. 24A to 25B will now be described. In the substrate treating apparatus 1 in FIGS. 24A to 25B, the second ID block 4 takes a substrate W from the carrier C on the platform 47, and sends the taken substrate W to the treatment layer 3A. Then, the first ID block 2 returns (accommodates) the substrate W, treated in the treatment layer 3D, into the carrier C on the platform 13. Here, the treatment layers 3A to 3D perform predetermined first to fourth treatments, respectively.

Figure 24A:
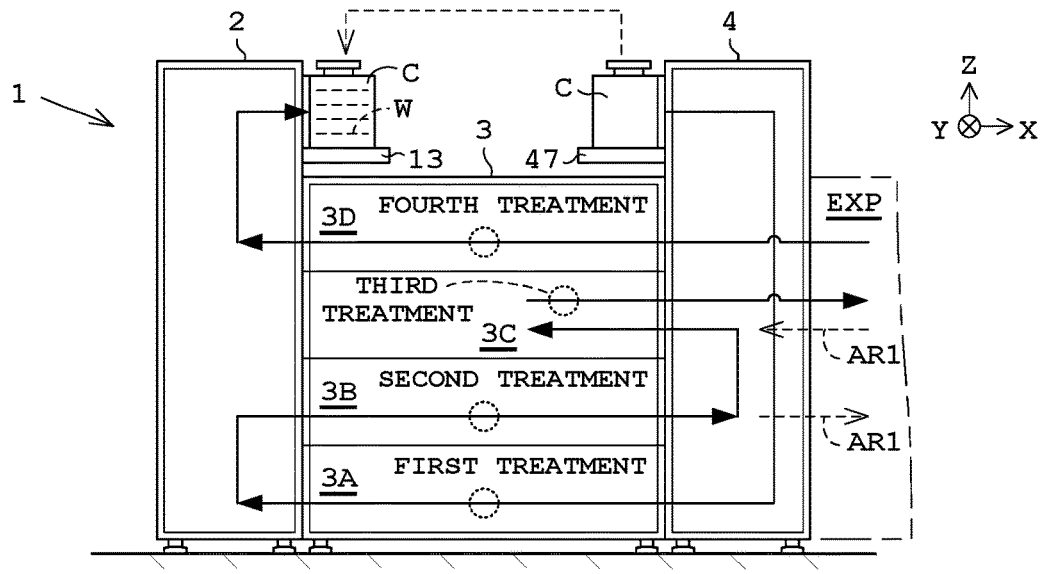
FIGS. 24A to 24C each illustrate a configuration and operation of a substrate treating apparatus according to one modification.

In FIG. 24A, the substrate W taken from the carriers C on the platform 47 of the second ID block 4 is transported to the treatment layer 3A, the first ID block 2, the treatment layer 3B, the second ID block 4, the treatment layer 3C, the second ID block 4, the exposure device EXP, the second ID block 4, the treatment layer 3D, and the first ID block 2, in this order. Moreover, as illustrated by the arrow AR1 by dotted lines in FIG. 24A, the exposure device EXP may perform the exposure treatment between the treatment layer 3B and the treatment layer 3C.

Figure 24B:
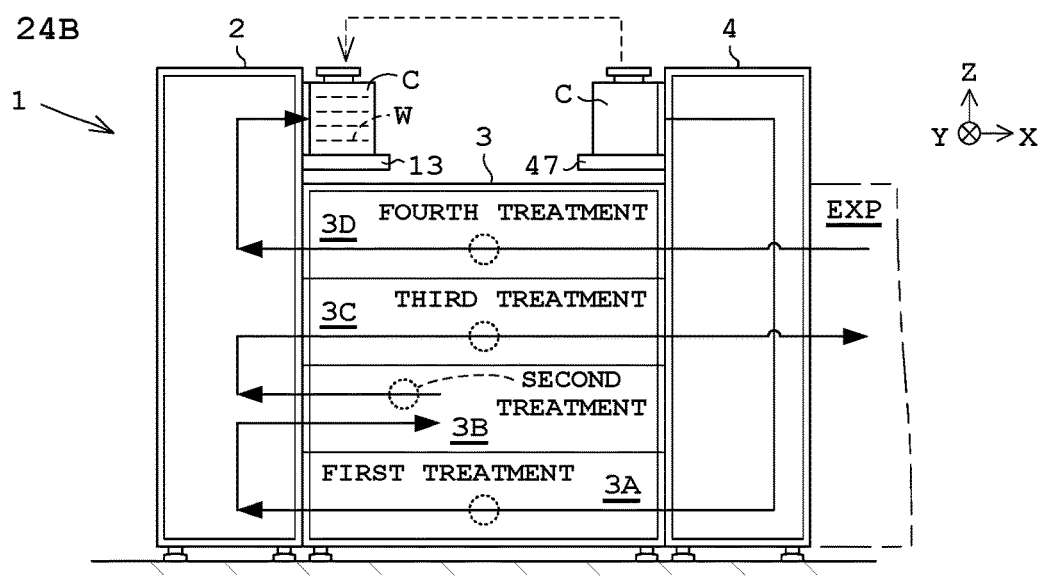

In FIG. 24B, the substrate W taken from the carriers C on the platform 47 of the second ID block 4 is transported to the treatment layer 3A, the first ID block 2, the treatment layer 3B, the first ID block 2, the treatment layer 3C, the second ID block 4, the exposure device EXP, the second ID block 4, the treatment layer 3D, and the first ID block 2, in this order.

Figure 24C:
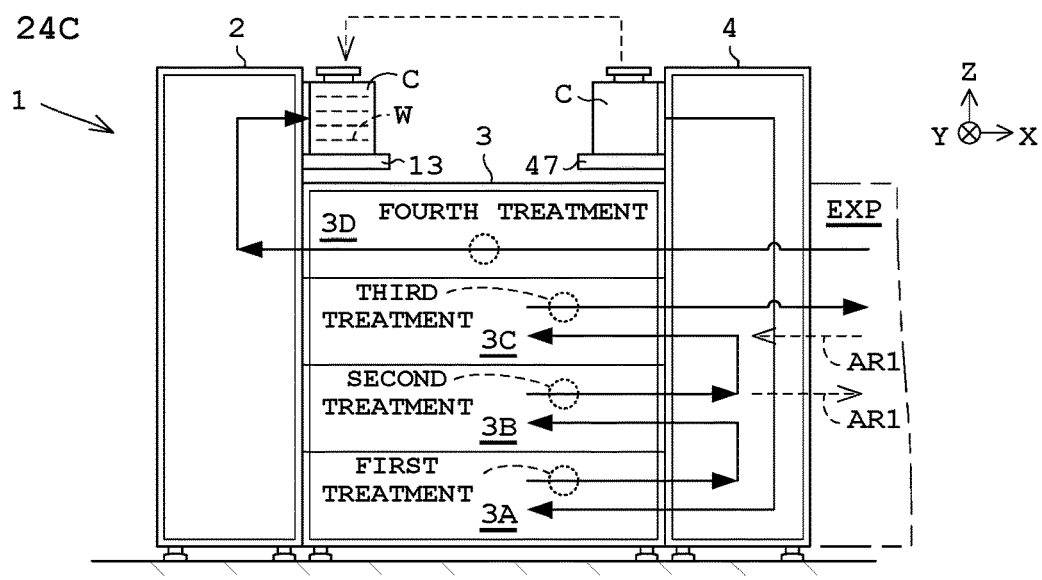

In FIG. 24C, the substrate W taken from the carriers C on the platform 47 of the second ID block 4 is transported to the treatment layer 3A, the second ID block 4, the treatment layer 3B, the second ID block 4, the treatment layer 3C, the second ID block 4, the exposure device EXP, the second ID block 4, the treatment layer 3D, and the first ID block 2, in this order. Moreover, as illustrated by the arrow AR1 by dotted lines in FIG. 24C, the exposure device EXP may perform the exposure treatment between the treatment layer 3B and the treatment layer 3C.

Figure 25A:
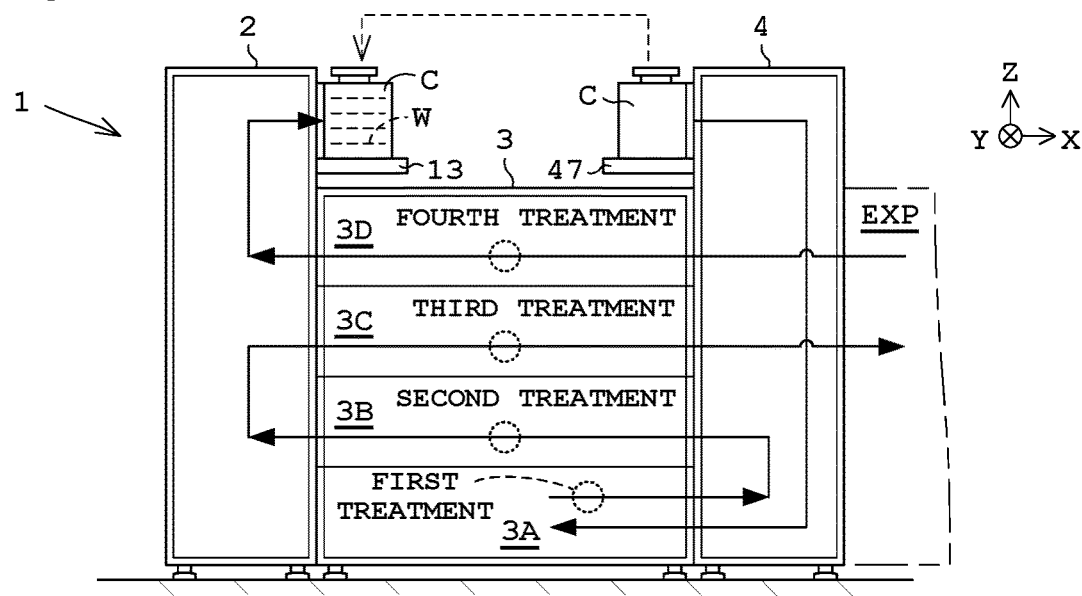
FIGS. 25A and 25B each illustrate a configuration and operation of a substrate treating apparatus according to one modification.

In FIG. 25A, the substrate W taken from the carriers C on the platform 47 of the second ID block 4 is transported to the treatment layer 3A, the second ID block 4, the treatment layer 3B, the first ID block 2, the treatment layer 3C, the second ID block 4, the exposure device EXP, the second ID block 4, the treatment layer 3D, and the first ID block 2, in this order.

Figure 25B:
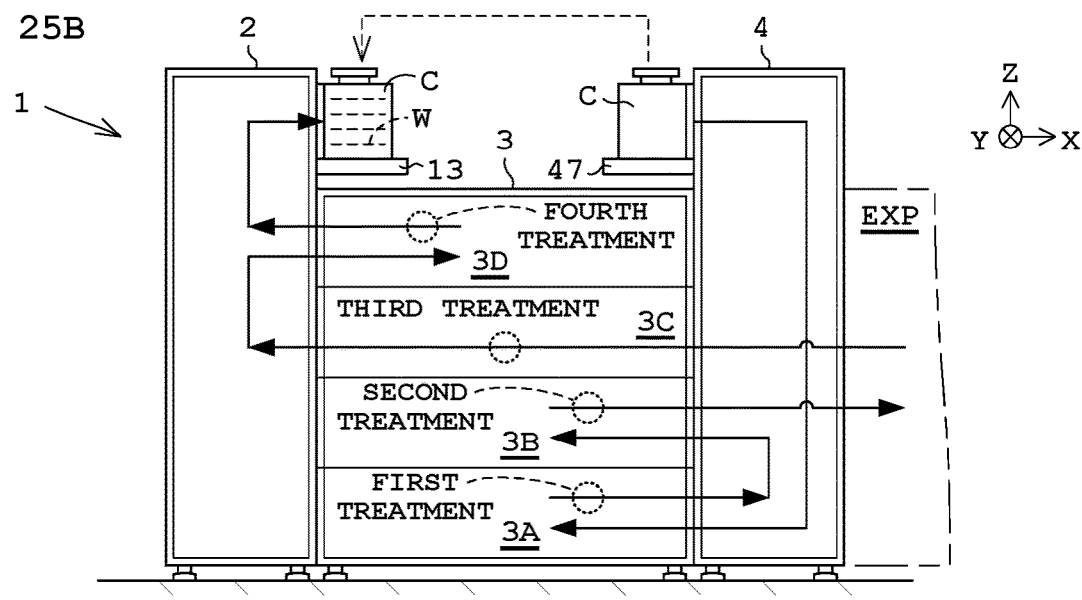

In FIG. 25B, the substrate W taken from the carriers C on the platform 47 of the second ID block 4 is transported to the treatment layer 3A, the second ID block 4, the treatment layer 3B, the second ID block 4, the exposure device EXP, the second ID block 4, the treatment layer 3C, the first ID block 2, the treatment layer 3D, and the first ID block 2, in this order.

(9) In the fourth and fifth embodiments described above, the first substrate transport mechanism TM1 in the first ID block 2 transports a substrate W between the seven substrate platforms PS1A to PS7A and the carrier C of the opener 9, as illustrated in FIG. 13. Moreover, the second substrate transport mechanism TM2 transports a substrate W between the seven substrate platforms PS1A to PS7A and the carrier C on the opener 10.

Figure 26:
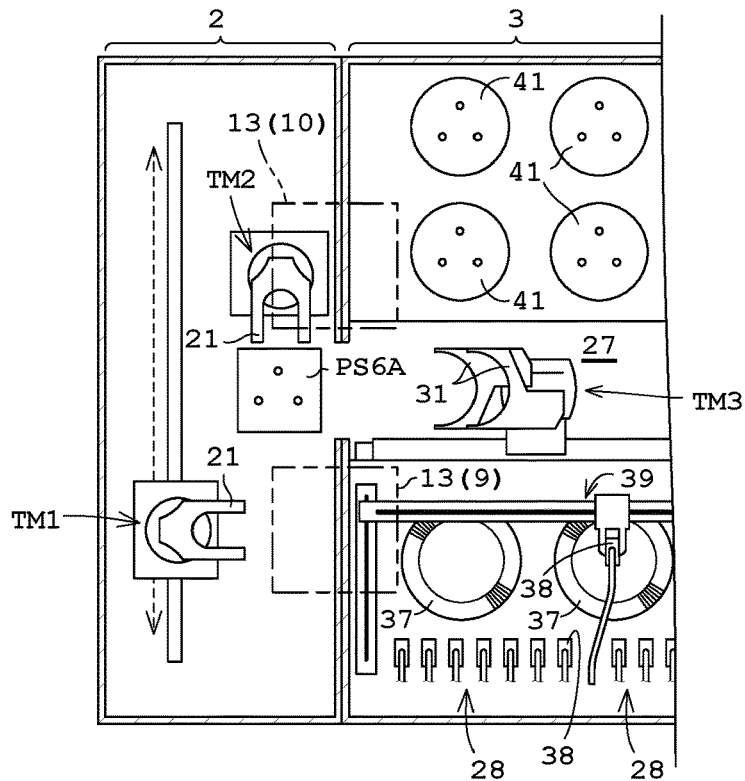
FIG. 26 is a horizontal cross-sectional view of a first indexer block according to one modification.

Regarding functions of the two substrate transport mechanisms TM1, TM2, the second substrate transport mechanism TM2 may transport a substrate W among the four substrate platforms PS1A to PS4A. In this case, the first substrate transport mechanism TM1 may transport a substrate W between the three substrate platforms PS5A to PS7A and the carrier C on the opener 9. Such task is changeable between the first substrate transport mechanism TM1 and the second substrate transport mechanism TM2. For instance, as illustrated in FIG. 26, the first substrate transport mechanism TM1 may be configured to be movable in a Y-direction where the openers 9, 10 are arranged, and the second substrate transport mechanism TM2 may be arranged between the first substrate transport mechanism TM1 and the treating block 3.

(10) In the fourth and fifth embodiments described above, the fourth substrate transport mechanism TM4 of the second ID block 4 transports a substrate W among the eight substrate platforms PS1A to PS7A, PS9, the pre-exposure cleaning unit 161, the post-exposure cleaning unit 162, the heating/cooling units PHP, the three mounting-cum-cooling units P-CP and the carrier C placed on the opener 45, as illustrated in FIG. 13. Moreover, the fifth substrate transport mechanism TM5 transports a substrate W among the eight substrate platforms PS1A to PS7A, PS9, the pre-exposure cleaning unit 161, the post-exposure cleaning unit 162, the heating/cooling units PHP, the three mounting-cum-cooling units P-CP and the carrier C placed on the opener 46.

For instance, the fifth substrate transport mechanism TM5 may transport a substrate W among the six substrate platforms PS3B to PS7B, PS9, the pre-exposure cleaning unit 161, the post-exposure cleaning unit 162, the heating/cooling units PHP, and the three mounting-cum-cooling units P-CP. In this case, the fourth substrate transport mechanism TM4 may transport a substrate W among the two substrate platforms PS1B, PS2B, and the carrier C on the opener 45. Such task is changeable between the fourth substrate transport mechanism TM4 and the fifth substrate transport mechanism TM5.

(11) In the above embodiments and modifications, the treating block 3 illustrated in FIG. 15 includes the two treatment layers 3A, 3B for performing the first coating treatment, the two treatment layers 3C, 3D for performing the second coating treatment, and the three treatment layers 3E to 3G for performing the developing treatment arranged therein in this order from the bottom, for example. However, such arrangement of the treatment layers in the upward/ downward direction is not limitative. Alternatively, the three treatment layers 3E to 3G for performing the developing treatment may be arranged below the two treatment layers 3A, 3B for performing the first coating treatment, for example.

(12) In the above embodiments and modifications, the two lower treatment layers 3A, 3B illustrated in FIG. 15 may each form an antireflection film and a resist film on the substrate W. Moreover, the two middle treatment layers 3C, 3D may each form a resist cover film and may each perform the rear-face cleaning treatment on the substrate W. Moreover, the three upper treatment layers 3E to 3G may perform a developing treatment on the substrate W.

Figure 27:
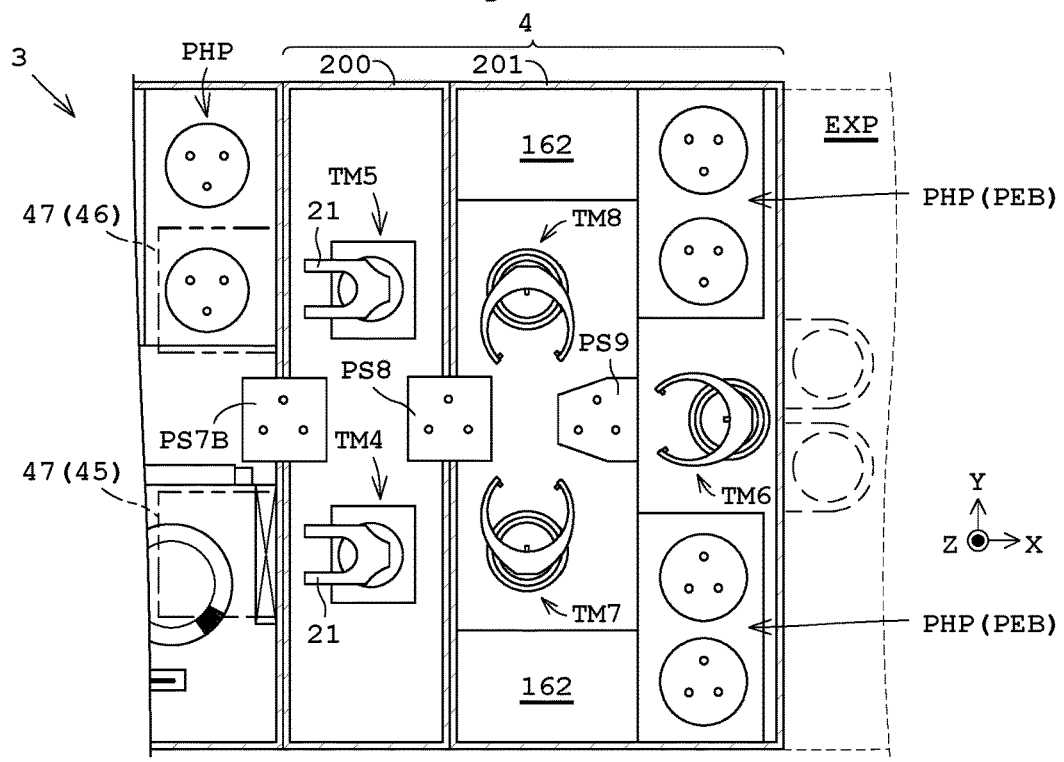
FIG. 27 is a horizontal cross-sectional view of a second indexer block according to one modification.

(13) In the fourth and fifth embodiments described above, the second ID block 4 functions as an interface block. As illustrated in FIG. 27, the second ID block 4 may include an ID block body 200, and an interface block (hereinafter, referred to as an "IF block", where appropriate) 201. In this case, the ID block body 200 includes two openers 45, 46, and two substrate transport mechanisms TM4, TM5. The IF block 201 includes two substrate transport mechanisms TM7, TM8 in addition to the pre-exposure cleaning unit 161, the post-exposure cleaning unit 162, the heating/cooling units PHP, and the sixth substrate transport mechanism TM6. Here, a substrate platform PS8 is disposed between the ID block body 200 and the IF body 201. The substrate platform PS8 is separated for use in sending and returning the substrate W.

Figure 28:
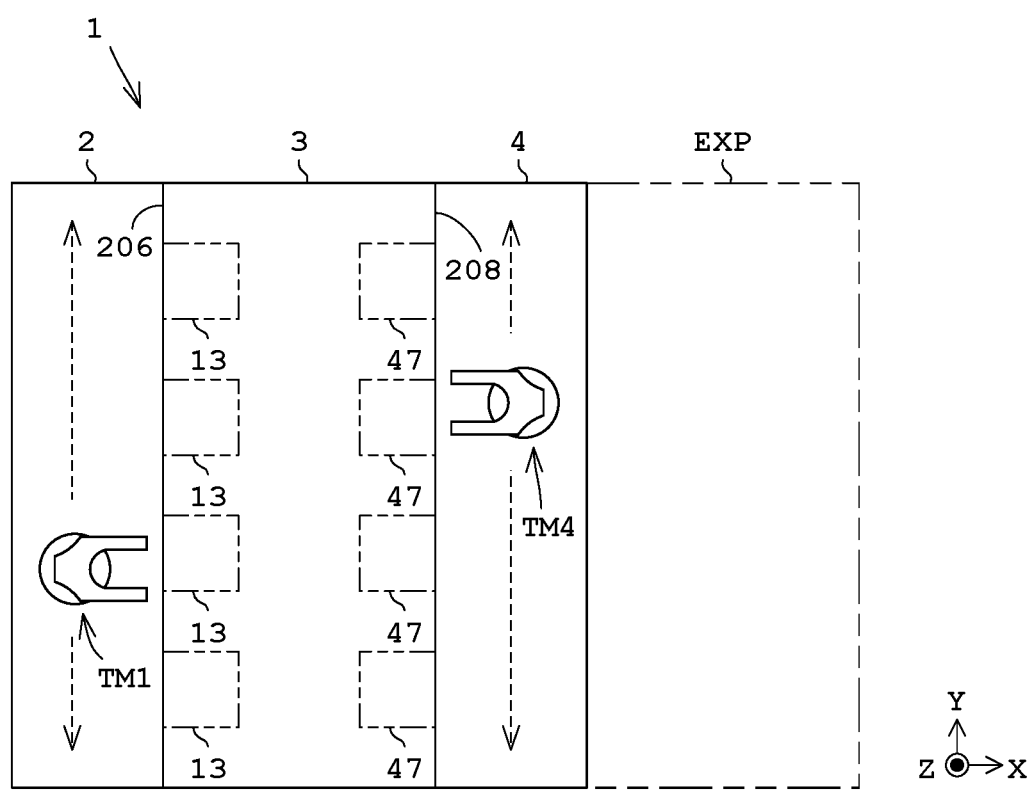
FIG. 28 is a horizontal cross-sectional view illustrating a substrate treating apparatus according to one modification.

(14) In the above embodiments and modifications, the first ID block 2 includes the two substrate transport mechanisms TM1, TM2. Alternatively, the first ID block 2 may include the single substrate transport mechanism TM1 as in FIG. 28. In this case, a plurality of (e.g., four) platforms 13 may be arranged on a wall 206 of the first ID block 2 in line in the Y-direction. The substrate transport mechanism TM1 may be configured in such a manner as to be movable in the Y-direction by an electric motor in order to take and accommodate substrates W from and into the carriers C placed on the platforms 13.

Moreover, as in the first embodiment, the single substrate transport mechanism TM1 may be fixed on a floor of the first ID block 2 so as not to move horizontally (especially, in Y-direction). Moreover, the first ID block 2 may include three or more substrate transport mechanisms.

(15) In the above embodiments and modifications, the second ID block 4 includes the two substrate transport mechanisms TM4, TM5. Alternatively, the second ID block 4 may include the single substrate transport mechanism TM4 as in FIG. 28. Also in this case, a plurality of (e.g., four) platforms 47 may be arranged on a wall 208 of the second ID block 4 in line in the Y-direction. The substrate transport mechanism TM4 may be configured in such a manner as to be movable in the Y-direction by an electric motor in order to take and accommodate substrates W from and into the carriers C placed on the platforms 47.

Moreover, as in the first embodiment, the single substrate transport mechanism TM4 may be fixed on a floor of the second ID block 4 so as not to move horizontally (especially, in Y-direction). Moreover, the second ID block 4 may include three or more substrate transport mechanisms.

(16) In the above embodiments and modifications, the treating block 3 includes six to seven treatment layers. However, this is not limitative as long as a plurality of treatment layer is provided.

(17) In the above embodiments and modifications, the treating block 3 includes a plurality of treatment layer (e.g., six treatment layers 3A to 3F) laminated in the upward/downward direction. In FIG. 1, in the treatment layers 3A to 3F, the third substrate transport mechanism TM3 is capable of transporting substrates W between the first ID block 2 and the second ID block 4 by itself. For instance, the single treating block 3 includes at least one treatment layer in which a substrate W is transportable between the two ID blocks 2, 4. For instance, in FIG. 1, the third substrate transport mechanism TM3 in the treatment layer 3A receives a substrate W from the substrate platform PS1A and then transports the received substrate W to the liquid-treating unit 28 and the heat treating unit 29 (see FIG. 2). Thereafter, the third substrate transport mechanism TM3 transports the substrate W to the substrate platform PS1B.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate of a plurality of substrates, comprising:
    a first indexer block on which a first carrier platform for placing a carrier capable of accommodating a portion of said plurality of substrates thereon is disposed;
    a single treating block connected to the first indexer block and in which a plurality of treatment layers is arranged in an upward/downward direction;
    a second indexer block connected to the single treating block and on which a second carrier platform for placing a carrier thereon is disposed;
    a carrier transport mechanism configured to transport the carrier between the first carrier platform and the second carrier platform; wherein
    the first indexer block takes a substrate from the carrier placed on the first carrier platform and transports the taken substrate to one of the treatment layers,
    the treatment layers each perform a predetermined treatment to the transported substrate, and transport the substrate to the second indexer block,
    the second indexer block returns back the substrate treated in the treatment layer to the carrier placed on the second carrier platform, and
    the carrier transport mechanism is mounted on the single treating block.

2. The substrate treating apparatus according to claim 1, wherein
    the first indexer block takes a substrate from the carrier placed on the first carrier platform and transports the substrate to a first treatment layer of the treatment layers,
    the first treatment layer performs a predetermined treatment to the transported substrate, and transports the substrate to the second indexer block,
    the second indexer block transports the transported substrate to a second treatment layer of the treatment layers,
    the second treatment layer performs a predetermined treatment to the transported substrate, and transports the substrate to the first indexer block,
    the first indexer block transports the transported substrate to a third treatment layer of the treatment layers,
    the third treatment layer performs a predetermined treatment to the transported substrate, and transports the substrate to the second indexer block, and
    the second indexer block returns back the substrate treated in the third treatment layer to the carrier placed on the second carrier platform.

3. The substrate treating apparatus according to claim 1, wherein
the first indexer block takes a substrate from the carrier placed on the first carrier platform and transports the substrate to a first treatment layer of the treatment layers,
the first treatment layer performs a predetermined treatment to the transported substrate, and transports the substrate to the second indexer block,
the second indexer block transports the transported substrate to a second treatment layer of the treatment layers,
the second treatment layer performs a predetermined treatment to the transported substrate, and transports the substrate to the second indexer block, and
the second indexer block returns back the substrate treated in the second treatment layer to the carrier placed on the second carrier platform.

4. The substrate treating apparatus according to claim 3, wherein
the second indexer block transports the substrate, treated and transported in the second treatment layer, to a third treatment layer of the treatment layers,
the third treatment layer performs a predetermined treatment to the transported substrate, and transports the substrate to the second indexer block, and
the second indexer block returns back the substrate treated in the third treatment layer to the carrier placed on the second carrier platform.

5. The substrate treating apparatus according to claim 4, wherein
the second indexer block is further configured to load and unload the substrate with respect to an external device,
the second indexer block unloads the substrate, treated in the second treatment layer, to the external device, and
the second indexer block loads the substrate, subjected to a predetermined treatment by the external device, from the external device and transports the loaded substrate to the third treatment layer of the treatment layers.

6. The substrate treating apparatus according to claim 3, wherein
the second indexer block is further configured to load and unload the substrate with respect to an external device,
the second indexer block unloads the substrate, treated in the first treatment layer, to the external device, and
the second indexer block loads the substrate, subjected to a predetermined treatment by the external device, from the external device and transports the loaded substrate to the second treatment layer of the treatment layers.

7. The substrate treating apparatus according to claim 1, wherein
the first indexer block takes a substrate from the carrier placed on the first carrier platform and transports the substrate to a first treatment layer of the treatment layers,
the first treatment layer performs a predetermined treatment to the transported substrate, and transports the substrate to the first indexer block,
the first indexer block transports the transported substrate to a second treatment layer of the treatment layers,
the second treatment layer performs a predetermined treatment to the transported substrate, and transports the substrate to the second indexer block, and
the second indexer block returns back the substrate treated in the second treatment layer to the carrier placed on the second carrier platform.

8. The substrate treating apparatus according to claim 7, wherein
the second indexer block transports the substrate, treated and transported in the second treatment layer, to a third treatment layer of the treatment layers,
the third treatment layer performs a predetermined treatment to the transported substrate, and transports the substrate to the second indexer block, and
the second indexer block returns back the substrate treated in the third treatment layer to the carrier placed on the second carrier platform.

9. The substrate treating apparatus according to claim 8, wherein
the second indexer block is further configured to load and unload the substrate with respect to an external device,
the second indexer block unloads the substrate, treated in the second treatment layer, to the external device, and
the second indexer block loads the substrate, subjected to a predetermined treatment by the external device, from the external device and transports the loaded substrate to the third treatment layer of the treatment layers.

10. The substrate treating apparatus according to claim 1, wherein
the first indexer block takes a substrate from the carrier placed on the first carrier platform and transports the substrate to a first treatment layer of the treatment layers,
the first treatment layer performs a predetermined treatment to the transported substrate, and transports the substrate to the first indexer block,
the first indexer block transports the transported substrate to a second treatment layer of the treatment layers,
the second treatment layer performs a predetermined treatment to the transported substrate, and transports the substrate to the first indexer block,
the first indexer block transports the transported substrate to a third treatment layer of the treatment layers,
the third treatment layer performs a predetermined treatment to the transported substrate, and transports the substrate to the second indexer block, and
the second indexer block returns back the substrate treated in the third treatment layer to the carrier placed on the second carrier platform.

11. The substrate treating apparatus according to claim 1, wherein
the second indexer block is further configured to load and unload the substrate with respect to an external device,
the second indexer block takes a substrate from the carrier placed on the second carrier platform and transports the substrate to a first treatment layer of the treatment layers,
the first treatment layer performs a predetermined treatment to the transported substrate, and transports the substrate to the second indexer block,
the second indexer block unloads the substrate, treated in the first treatment layer, to the external device,
the second indexer block loads the substrate, subjected to a predetermined treatment by the external device, from the external device and transports the loaded substrate to a second treatment layer of the treatment layers, and
the second treatment layer performs a predetermined treatment to the transported substrate, and transports the substrate to the first indexer block, and
the first indexer block returns back the substrate treated in the second treatment layer to the carrier placed on the first carrier platform.

12. The substrate treating apparatus according to claim 1, wherein
- the second indexer block is further configured to load and unload the substrate with respect to an external device,
- the second indexer block takes a substrate from the carrier placed on the second carrier platform and transports the substrate to a first treatment layer of the treatment layers,
- the first treatment layer performs a predetermined treatment to the transported substrate, and transports the substrate to the first indexer block,
- the first indexer block transports the transported substrate to a second treatment layer of the treatment layers,
- the second treatment layer performs a predetermined treatment to the transported substrate, and transports the substrate to the second indexer block,
- the second indexer block unloads the substrate, treated in the second treatment layer, to the external device,
- the second indexer block loads the substrate, subjected to a predetermined treatment by the external device, from the external device and transports the loaded substrate to a third treatment layer of the treatment layers,
- the third treatment layer performs a predetermined treatment to the transported substrate, and transports the substrate to the first indexer block, and
- the first indexer block returns back the substrate treated in the third treatment layer to the carrier placed on the first carrier platform.

* * * * *